(12) United States Patent
Sato

(10) Patent No.: US 11,183,524 B2
(45) Date of Patent: Nov. 23, 2021

(54) IMAGING DEVICE AND CAMERA SYSTEM

(71) Applicant: Panasonic Intellectual Property Management Co., Ltd., Osaka (JP)

(72) Inventor: Yoshihiro Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/846,851

(22) Filed: Apr. 13, 2020

(65) Prior Publication Data

US 2020/0243587 A1 Jul. 30, 2020

Related U.S. Application Data

(63) Continuation of application No. 15/955,748, filed on Apr. 18, 2018, now Pat. No. 10,658,406.

(30) Foreign Application Priority Data

May 12, 2017 (JP) .............................. JP2017-095958

(51) Int. Cl.
*H01L 27/146* (2006.01)
*H04N 5/363* (2011.01)
*H04N 5/3745* (2011.01)

(52) U.S. Cl.
CPC .. *H01L 27/14612* (2013.01); *H01L 27/14603* (2013.01); *H01L 27/14636* (2013.01);
(Continued)

(58) Field of Classification Search
None
See application file for complete search history.

(56) References Cited

U.S. PATENT DOCUMENTS 9,197,830 B2  11/2015  Mori et al.
9,917,119 B2   3/2018  Murakami et al.
(Continued)

FOREIGN PATENT DOCUMENTS

JP  2016127265 A  7/2016
JP  2016127593 A  7/2016
(Continued)

OTHER PUBLICATIONS

Notice of Allowance issued in related U.S. Appl. No. 15/955,748, dated Jan. 15, 2020.
(Continued)

*Primary Examiner* — Telly D Green
(74) *Attorney, Agent, or Firm* — McDermott Will & Emery LLP

(57) ABSTRACT

An imaging device including a semiconductor substrate; pixels arranged on the semiconductor substrate in a first direction; and a signal line extending in the first direction. Each of the pixels includes a photoelectric converter generating signal charge by photoelectric conversion, a charge accumulation region that accumulates the signal charge output from the photoelectric converter, a first transistor that outputs a signal to the signal line according to an amount of the signal charge accumulated in the charge accumulation region, a capacity circuit that is coupled to a gate of the first transistor and that includes a first capacitive element, the first capacitive element including a first electrode, a second electrode and an insulating layer between the first electrode and the second electrode, at least one of the first electrode and the second electrode containing a metal. The first capacitive element is closer to the semiconductor substrate than the signal line.

20 Claims, 30 Drawing Sheets

(52) U.S. Cl.
CPC ....... *H01L 27/14643* (2013.01); *H04N 5/363* (2013.01); *H04N 5/3745* (2013.01); *H04N 5/37452* (2013.01)

(56) References Cited

U.S. PATENT DOCUMENTS

| | | |
|---|---|---|
| 10,212,372 B2 | 2/2019 | Sato et al. |
| 2015/0115339 A1 | 4/2015 | Tamaki et al. |
| 2015/0195472 A1 | 7/2015 | Ishii |
| 2016/0013328 A1 | 1/2016 | Tashiro et al. |
| 2016/0190188 A1 | 6/2016 | Murakami et al. |
| 2016/0191825 A1 | 6/2016 | Sato et al. |
| 2016/0293654 A1 | 10/2016 | Tomekawa et al. |
| 2017/0250216 A1 | 8/2017 | Sato et al. |
| 2018/0166479 A1 | 6/2018 | Murakami et al. |

FOREIGN PATENT DOCUMENTS

| | | |
|---|---|---|
| JP | 2016197617 A | 11/2016 |
| JP | 2017046333 A | 3/2017 |
| WO | 2014002367 A1 | 1/2014 |

OTHER PUBLICATIONS

Final Office Action issued in related U.S. Appl. No. 15/955,748, dated Aug. 27, 2019.
Non-Final Office Action issued in related U.S. Appl. No. 15/955,748, dated May 13, 2019.
Notice of Allowance issued in U.S. Appl. No. 15/955,748, dated Jan. 15, 2020.
Final Office Action issued in U.S. Appl. No. 15/955,748, dated Aug. 27, 2019.
Non-Final Office Action issued in U.S. Appl. No. 15/955,748, dated May 13, 2019.

IMAGING DEVICE AND CAMERA SYSTEM

This application is a Continuation of U.S. patent application Ser. No. 15/955,748, filed on Apr. 18, 2018, which in turn claims the benefit of Japanese Application No. 2017-095958, filed on May 12, 2017, the entire disclosures of which Applications are incorporated by reference herein.

BACKGROUND

1. Technical Field

The present disclosure relates to an imaging device and, more particularly, to an imaging device that has a photoelectric converter including a photoelectric conversion film and being laminated on a semiconductor substrate.

2. Description of the Related Art

A laminated imaging device is proposed as an imaging device of the metal oxide semiconductor (MOS) type. In a laminated imaging device, a photoelectric conversion film is laminated on the topmost surface of a semiconductor substrate. In the imaging device, charges generated in the photoelectric conversion film by photoelectric conversion are accumulated in a charge accumulation region, which is referred to as a floating diffusion node. In the semiconductor substrate, the imaging device uses a charge coupled device (CCD) circuit or a complementary MOS (CMOS) circuit to read out the accumulated charges.

In the imaging device field, there is a demand to reduce noise. Particularly, there is a demand to reduce kTC noise generated at the time of resetting. Sometimes, kTC noise is referred to as reset noise.

International Publication No. 2014/002367 discloses an imaging device in which a feedback circuit is provided. The feedback circuit negatively feeds back an output signal from an amplification transistor in a pixel. International Publication No. 2014/002367 discloses that the influence of kTC noise can be reduced by forming a feedback circuit when a charge accumulation region is reset. A power supply line is placed between a feedback signal line connected to the output terminal of a feedback amplifier and a metal line that is in the charge accumulation region and is placed in the same layer as the feedback signal line. Accordingly, a coupling capacitance between the feedback signal line and the metal line is reduced.

The entire contents disclosed in International Publication No. 2014/002367 are incorporated in this specification for reference purposes.

Japanese Unexamined Patent Application Publication No. 2016-127593 discloses an imaging device in which a feedback circuit is formed within a pixel to reduce noise at high speed.

SUMMARY

There is a demand for an imaging device that can more reduce the influence of kTC noise and for a camera system equipped with the imaging device.

One non-limiting and exemplary embodiment in the present disclosure provides an imaging device described below.

In one general aspect, the techniques disclosed here feature an imaging device including a semiconductor substrate; pixels arranged on the semiconductor substrate in a first direction; and a signal line extending in the first direction. Each of the pixels includes a photoelectric converter generating signal charge by photoelectric conversion, a charge accumulation region that accumulates the signal charge output from the photoelectric converter, a first transistor that outputs a signal to the signal line according to an amount of the signal charge accumulated in the charge accumulation region, a capacity circuit that is coupled to a gate of the first transistor and that includes a first capacitive element, the first capacitive element including a first electrode, a second electrode and an insulating layer between the first electrode and the second electrode, at least one of the first electrode and the second electrode containing a metal. The first capacitive element is closer to the semiconductor substrate than the signal line.

It should be noted that comprehensive or specific aspects may be implemented as an element, a device, a module, a system, an integrated circuit, a method, or any selective combination thereof.

Additional benefits and advantages of the disclosed embodiments will become apparent from the specification and drawings. The benefits and/or advantages may be individually obtained by the various embodiments or features disclosed in the specification and drawings, which need not all be provided in order to obtain one or more of such benefits and/or advantages.

DETAILED DESCRIPTION

Figure 1:
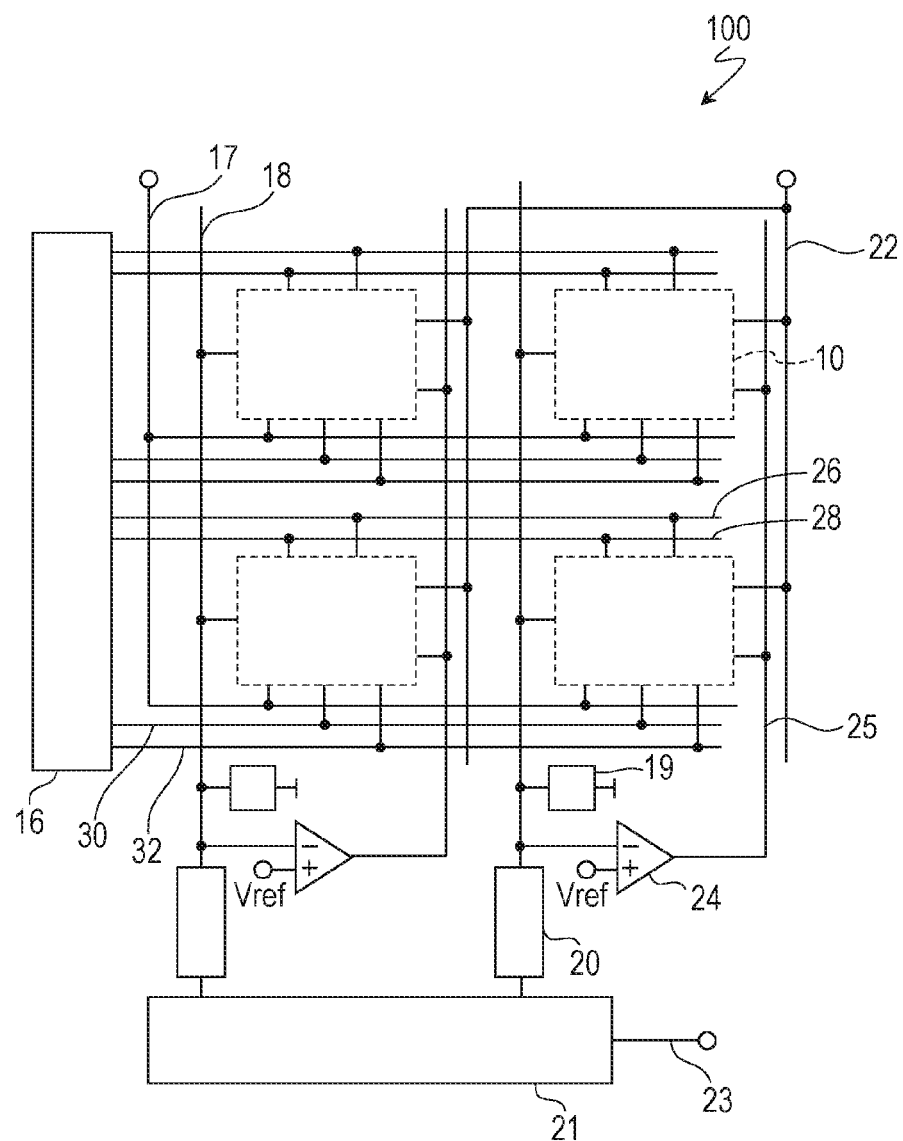
FIG. 1 schematically illustrates an exemplary circuit structure of an imaging device according to a first embodiment.

One aspect of the present disclosure will be outlined below.

Item 1

An imaging device comprising:
a semiconductor substrate;
pixels arranged on the semiconductor substrate in a first direction; and
a signal line that extends in the first direction, a signal from each of the pixels being transferred through the signal line; wherein
each of the pixels including
a photoelectric converter that generates a charge by photoelectric conversion,
a charge accumulation region that accumulates the charge,
an amplification transistor that has a gate electrically connected to the charge accumulation region, the amplification transistor outputting a signal to the signal line according to an amount of charge accumulated in the charge accumulation region,
a first capacitor having a first terminal and a second terminal, the first terminal being electrically connected to the charge accumulation region,
a second capacitor having a third terminal and a fourth terminal, the third terminal being electrically connected to the second terminal, a reference voltage being applied to the fourth terminal,
a feedback transistor having a source and a drain, one of the source and the drain being electrically connected to the second terminal, and
a feedback circuit that forms a feedback path through which an output from the amplification transistor is negatively fed back to the charge accumulation region, and a first part of the feedback path is located closer to the semiconductor substrate than the signal line is, the first part being a path from the feedback transistor to the first capacitor.

Item 2

The imaging device according to Item 1, wherein:
the second capacitor has a first electrode, a second electrode located farther away from the semiconductor substrate than the first electrode is, and a dielectric layer located between the first electrode and the second electrode; and
the one of the source and the drain of the feedback transistor is electrically connected to the second terminal of the first capacitor through the first electrode.

Item 3

The imaging device according to Item 1, wherein the one of the source and the drain of the feedback transistor is electrically connected to the second terminal of the first capacitor through a semiconductor layer located above the semiconductor substrate.

Item 4

The imaging device according to Item 1, wherein:
one of the source and the drain of the amplification transistor and the other of the source and the drain of the feedback transistor are electrically connected to each other within the pixel; and
a second part of the feedback path of the feedback path is located closer to the semiconductor substrate than the signal line is, the second part being a path from the amplification transistor to the first capacitor.

Item 5

The imaging device according to Item 4, wherein the one of the source and the drain of the amplification transistor is electrically connected to the other of the source and the drain of the feedback transistor through a semiconductor layer located above the semiconductor substrate.

Item 6

The imaging device according to Item 4, wherein:
the amplification transistor includes a first diffusion layer formed in the semiconductor substrate as the one of the source and the drain of the amplification transistor;
the feedback transistor includes a second diffusion layer formed in the semiconductor substrate as the one of the source and the drain of the feedback transistor; and
the first diffusion layer and the second diffusion layer form a continuous single diffusion layer.

Item 7

The imaging device according to any one of Items 1 to 3, wherein:
the feedback circuit includes an inverting amplifier; and
one of the source and the drain of the amplification transistor is electrically connected to the other of the source and the drain of the feedback transistor through the inverting amplifier.

Item 8

The imaging device according to Item 7, comprising a feedback line that extends in the first direction, an output from the inverting amplifier being transmitted through the feedback line, wherein
the feedback line and the signal line are included in a same wiring layer.

Item 9

The imaging device according to any one of Items 1 to 8, wherein the second capacitor is located farther away from the semiconductor substrate than the signal line is.

Item 10

The imaging device according to any one of Items 1 to 9, wherein the photoelectric converter includes a pixel electrode electrically connected to the charge accumulation region, a counter electrode facing the pixel electrode, and a photoelectric conversion layer disposed between the pixel electrode and the counter electrode.

Item 11

The imaging device according to any one of Items 1 to 9, wherein the photoelectric converter includes a photodiode in the semiconductor substrate.

Item 12

The imaging device according to Item 11, wherein the charge accumulation region is electrically connected to the photoelectric converter through a transfer transistor.

Item 13

A camera system comprising:
the imaging device according to any one of Items 1 to 12;
a lens optical system that focuses light onto the imaging device; and
a camera signal processor that processes a signal output from the imaging device.

Embodiments will be described in detail with reference to the drawings. All embodiments described below illustrate general or specific examples. Numerals, shapes, materials, constituent elements, the placement and connection forms of these constituent elements, steps, the sequence of these steps, and the like are only examples, and are not intended to restrict the present disclosure. Various aspects described in this specification can be mutually combined unless any contradiction occurs. Of the constituent elements described in the embodiments below, constituent elements not described in independent claims, each of which indicates the topmost concept, will be described as optional constituent elements. In the description below, constituent elements having essentially the same function will be given the same reference characters and descriptions will sometimes be omitted, First Embodiment FIG. 1 schematically illustrates an exemplary circuit structure of an imaging device 100 according to a first embodiment.

The imaging device 100 illustrated in FIG. 1 has a plurality of pixels 10 and a peripheral circuit.

The plurality of pixels 10 form a pixel area by being two-dimensionally placed on a semiconductor substrate. The semiconductor substrate is not restricted to a substrate the whole of which is a semiconductor. The semiconductor substrate may be, for example, an insulative substrate having a semiconductor layer on a surface on which a pixel area is formed.

In the example in FIG. 1, the plurality of pixels 10 are placed in a row-wise direction and in a column-wise direction. In this specification, the row-wise direction is a direction in which rows extend and the column-wise direction is a direction in which columns extend. That is, the vertical direction is the column-wise direction and the horizontal direction is the row-wise direction.

The plurality of pixels 10 may be one-dimensionally placed. In other words, the imaging device 100 may be a line sensor.

Each pixel 10 is connected to a power supply line 22. A predetermined power supply voltage is supplied to each pixel 10 through the power supply line 22. Each pixel 10 includes a photoelectric converter having a photoelectric conversion film laminated on the semiconductor substrate, as will be described later in detail. The photoelectric converter is disposed on the semiconductor substrate with wiring layers intervening therebetween, as will be described later in detail with reference to the drawings. The imaging device 100 also has an accumulation control line 17 used to apply the same constant voltage to all photoelectric converters, as illustrated in FIG. 1.

The peripheral circuit includes a vertical scanning circuit 16, a load circuit 19, a column signal processing circuit 20, a horizontal signal read-out circuit 21, and an inverting amplifier 24. In the structure in FIG. 1, a combination of the column signal processing circuit 20, load circuit 19, and inverting amplifier 24 is placed for each column of two-dimensionally placed pixels 10. That is, in this example, the peripheral circuit includes a plurality of column signal processing circuits 20, a plurality of load circuits 19, and a plurality of inverting amplifiers 24.

The vertical scanning circuit 16 (also referred to as the row scanning circuit) is connected to address signal lines 30 and reset signal lines 26. The vertical scanning circuit 16 applies a predetermined voltage to the address signal lines 30 or reset signal lines 26 to select a plurality of pixels 10 placed in each row on a per-row basis. Thus, the signal voltage of the selected pixels 10 is read out, or a second electrode is reset.

In the example in FIG. 1, the vertical scanning circuit 16 is also connected to feedback control lines 28 and sensitivity adjustment lines 32. When the vertical scanning circuit 16 applies a predetermined voltage to a feedback control line 28, a feedback circuit used to negatively feed back an output from the relevant pixels 10 can be formed.

The vertical scanning circuit 16 can apply a predetermined voltage to a plurality of pixels 10 through the relevant sensitivity adjustment line 32. In the present disclosure, each pixel 10 internally has at least one capacitor, as will be described later in detail. In this specification, the capacitor has a structure in which a dielectric body is sandwiched between electrodes. The electrode in this specification is not limited to an electrode formed from a metal but is interpreted as widely including a polysilicon layer and the like.

The pixels 10 placed in each column are electrically connected to the column signal processing circuit 20 (also referred to as the row signal accumulation circuit) corresponding to the column through a vertical signal line 18 corresponding to the column. The load circuit 19 is electrically connected to the vertical signal line 18. The column signal processing circuit 20 performs noise suppression signal processing typified by correlated double sampling, analog-digital conversion (AD conversion), and other processing. The horizontal signal read-out circuit 21 (also referred to as the column scanning circuit) is electrically connected to a plurality of column signal processing circuits 20, each of which is provided in correspondence to one column of pixels 10. The horizontal signal read-out circuit 21 successively reads out signals from the plurality of column signal processing circuits 20 and outputs the read-out signals to a horizontal common signal line 23.

In the structure illustrated in FIG. 1, each of the plurality of inverting amplifiers 24 is provided in correspondence to one column. The negative input terminal of the inverting amplifier 24 is connected to its corresponding vertical signal line 18. A predetermined voltage Vref is supplied to the positive input terminal of the inverting amplifier 24. The predetermined voltage Vref is, for example, 1 V or a positive voltage near 1V. The output terminal of the inverting amplifier 24 is connected through one of feedback lines 25, each of which is provided in correspondence to one column, to a plurality of pixels 10 having a connection to the negative input terminal of the inverting amplifier 24. The inverting amplifier 24 forms part of a feedback circuit used to negatively feed back an output from the pixels 10. The inverting amplifier 24 may be referred to as the feedback amplifier.

Figure 2:
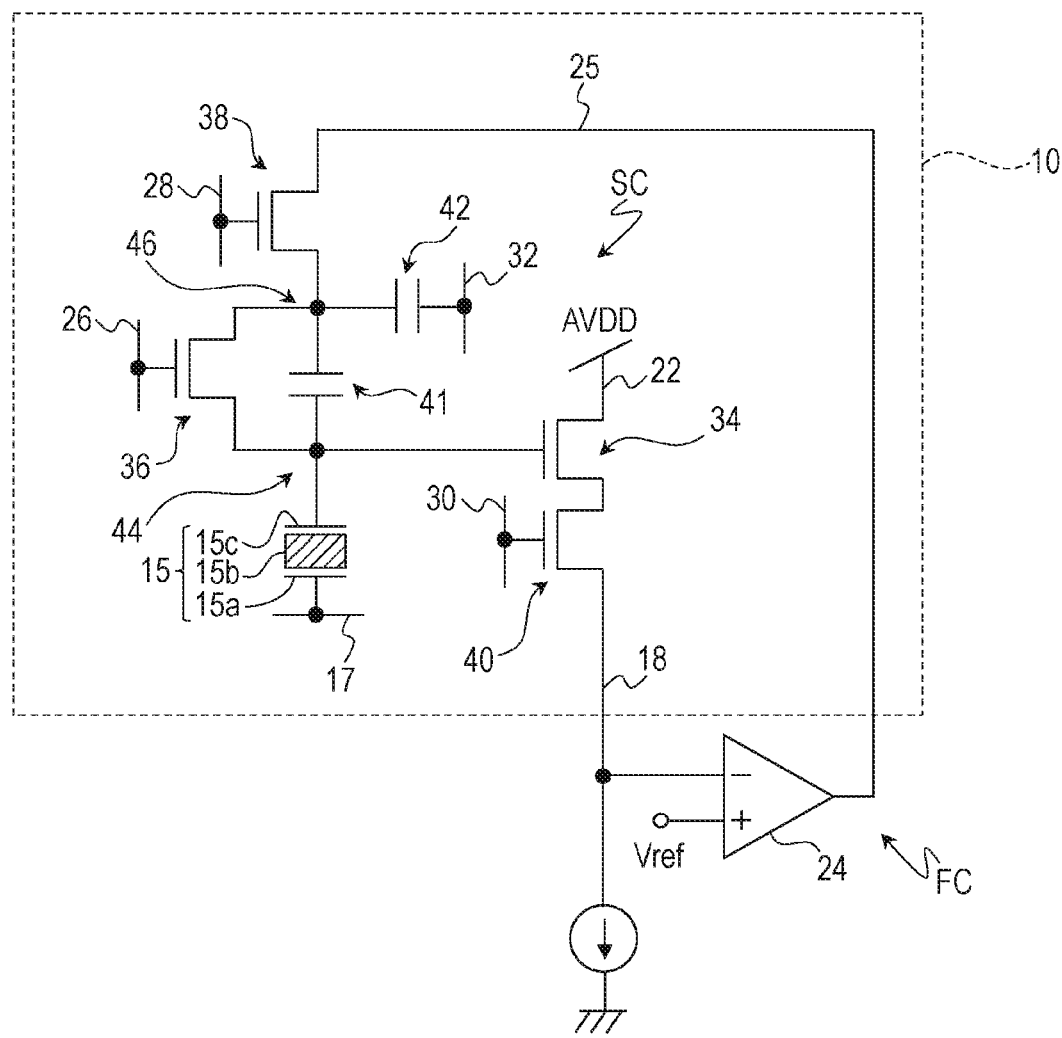
FIG. 2 schematically illustrates an exemplary circuit structure of a pixel according to the first embodiment.

FIG. 2 schematically illustrates an exemplary circuit structure of the pixel 10.

The pixel 10 includes a photoelectric converter 15 that performs photoelectric conversion on incident light and also includes a signal detection circuit SC that detects a signal generated by the photoelectric converter 15.

Typically, the photoelectric converter 15 has a structure in which a photoelectric conversion film 15b is sandwiched between a first electrode 15a and a second electrode 15c. The photoelectric conversion film 15b is laminated on the semiconductor substrate on which pixels 10 are formed, as will be described later with reference to a drawing. The photoelectric conversion film 15b is formed from an organic material or an inorganic material such as amorphous silicon.

The first electrode 15a is disposed on the light receiving surface of the photoelectric conversion film 15b. The first electrode 15a is formed from a transparent conductive material such as indium tin oxide (ITO). The second electrode 15c is provided so as to face the first electrode 15a with the photoelectric conversion film 15b intervening therebetween. The second electrode 15c collects charges generated in the photoelectric conversion film 15b due to photoelectric conversion. The second electrode 15c is formed from a metal such as aluminum or copper, polysilicon doped with an impurity to have conductivity, or another material.

As illustrated in FIG. 2, the first electrode 15a is connected to the accumulation control line 17 and the second electrode 15c is connected to a charge accumulation region 44 (also referred to as floating diffusion node). When the potential of the first electrode 15a is controlled through the accumulation control line 17, any one of a hole or an electron of a hole-electron pair generated due to photoelectric conversion can be collected by the second electrode 15c. To use a hole as a signal charge, it is only needed that the potential of the first electrode 15a is higher than the potential of the second electrode 15c. A case in which a hole is used as a signal charge will be described below as an example. A voltage of about 10 V, for example, is applied to the first electrode 15a through the accumulation control line 17. Thus, a signal charge is accumulated in the charge accumulation region 44. Of course, an electron may be used as a signal charge.

The signal detection circuit SC included in the pixel 10 has an amplification transistor 34, a reset transistor 36, a first capacitor 41, and a second capacitor 42. In the structure illustrated in FIG. 2, the second capacitor 42 has a larger capacitance than the first capacitor 41. In the structure in FIG. 2, one of the source and drain of the reset transistor 36 and one of the electrodes of the first capacitor 41 are connected to the charge accumulation region 44. That is, the source or drain of the reset transistor 36 and one electrode of the first capacitor 41 each have an electrical connection to the second electrode 15c. The other of the source and drain of the reset transistor 36 and the other electrode of the first capacitor 41 are connected to one of the electrodes of the second capacitor 42. In other words, the first capacitor 41 is connected between the source and drain of the reset transistor 36. In the description below, a node including a connection point between the first capacitor 41 and the second capacitor 42 will sometimes be referred to as a reset drain node 46.

Of the electrodes of the second capacitor 42, an electrode that is not connected to the reset drain node 46 is connected to the sensitivity adjustment line 32. The potential of the sensitivity adjustment line 32 is set to, for example, 0 V. When the imaging device 100 operates, the potential of the sensitivity adjustment line 32 does not need to remain unchanged. For example, a pulse voltage may be supplied from the vertical scanning circuit 16 (see FIG. 1). The sensitivity adjustment line 32 can be used to control the potential of the charge accumulation region 44, as will be described later.

As illustrated in FIG. 2, the gate of the amplification transistor 34 is connected to the charge accumulation region 44. In other words, the gate of the amplification transistor 34 has an electrical connection to the second electrode 15c. One of the source and drain of the amplification transistor 34 (drain if the amplification transistor 34 is an N-channel MOS transistor) is connected to the power supply line 22 (source follower power supply), and the other is connected to the vertical signal line 18, which is a signal line through which an electric signal output from the amplification transistor 34 is transmitted. A source follower circuit is formed from the amplification transistor 34 and load circuit 19 (see FIG. 1). The amplification transistor 34 amplifies a signal created by the photoelectric converter 15.

As illustrated in FIG. 2, the pixel 10 includes an address transistor 40 (line selection transistor). The source or drain of the address transistor 40 is connected to either terminal of the amplification transistor 34, source or drain, which is not connected to the power supply line 22. The gate of the address transistor 40 is connected to the address signal line 30. In the structure illustrated in FIG. 2, the address transistor 40 forms part of the signal detection circuit SC.

A voltage is applied to the gate of the amplification transistor 34 according to the amount of charge accumulated in the charge accumulation region 44. The amplification transistor 34 amplifies this voltage. The voltage amplified by the amplification transistor 34 is selectively read out as an electric signal by the address transistor 40.

In the structure illustrated in FIG. 2, the pixel 10 further includes a feedback transistor 38. One of the source and drain of the feedback transistor 38 is connected to the reset drain node 46, and the other is connected to the feedback line 25. That is, in the structure illustrated structure, the feedback line 25 and either terminal of the reset transistor 36, source or drain, which is connected to the reset drain node 46, are connected together through the feedback transistor 38. The gate of the feedback transistor 38 is connected to the feedback control line 28. When the feedback transistor 38 is turned on by controlling the voltage of the feedback control line 28, a feedback path including the charge accumulation region 44 and feedback transistor 38 is formed by turning on the reset transistor 36. That is, a feedback circuit FC that negatively feeds back an output of the signal detection circuit SC can be formed. The feedback circuit FC is formed for one of a plurality of pixels 10 that share the feedback line 25.

The amplification transistor 34, reset transistor 36, address transistor 40, and feedback transistor 38 may be each an N-channel MOS transistor or a P-channel MOS transistor. In addition, they do not need to be of the same type, N-channel MOS or P-channel MOS. In the description below, a case in which the amplification transistor 34, reset transistor 36, address transistor 40, and feedback transistor 38 are each an N-channel MOS transistor will be taken as an example.

Plan View of the Pixel and Device Structure

Next, the device structure of the pixel 10 will be described with reference to FIGS. 3 to 6.

Figure 3:
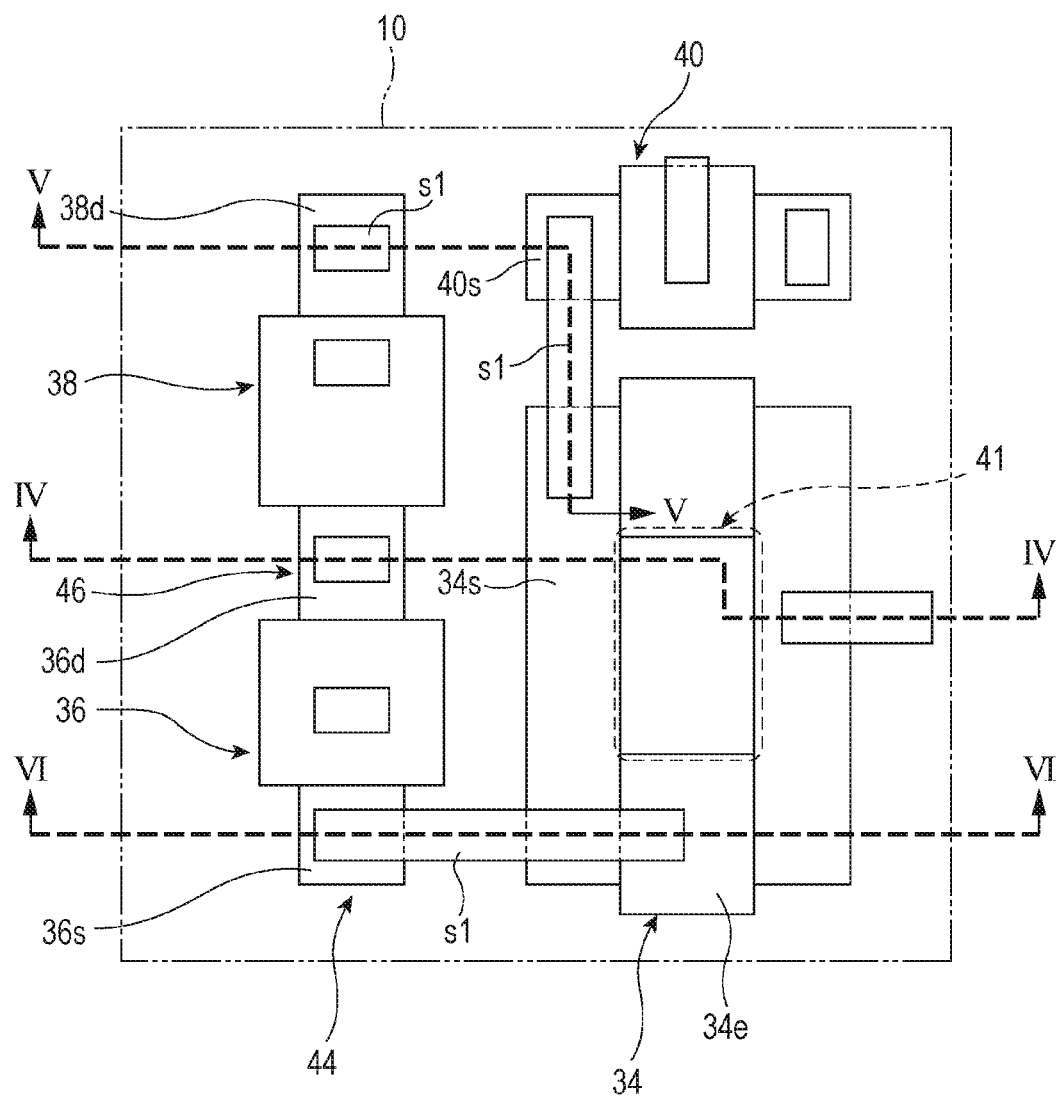
FIG. 3 is a plan view schematically illustrating an example of the layout of some elements and some lines in the pixel according to the first embodiment.
Figure 4:
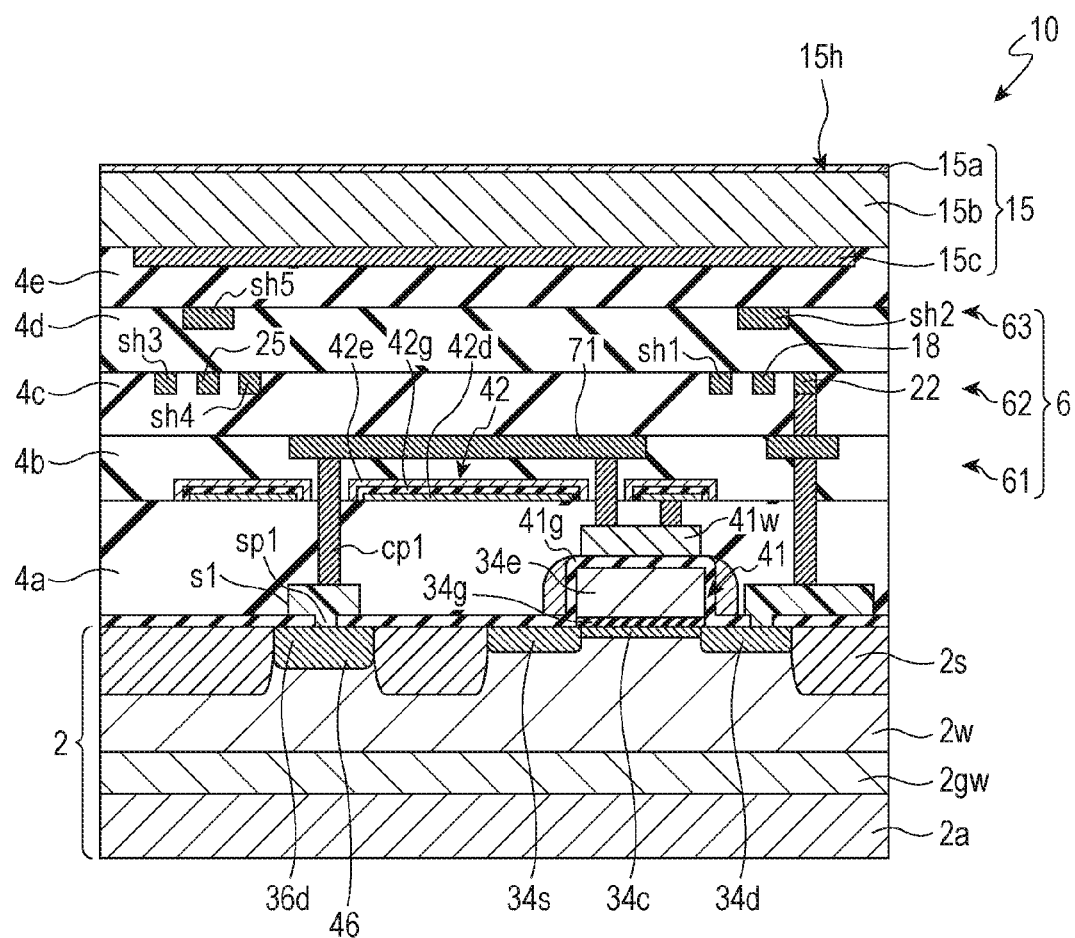
FIG. 4 is a schematic cross-sectional view taken along line IV-IV in FIG. 3.
Figure 5:
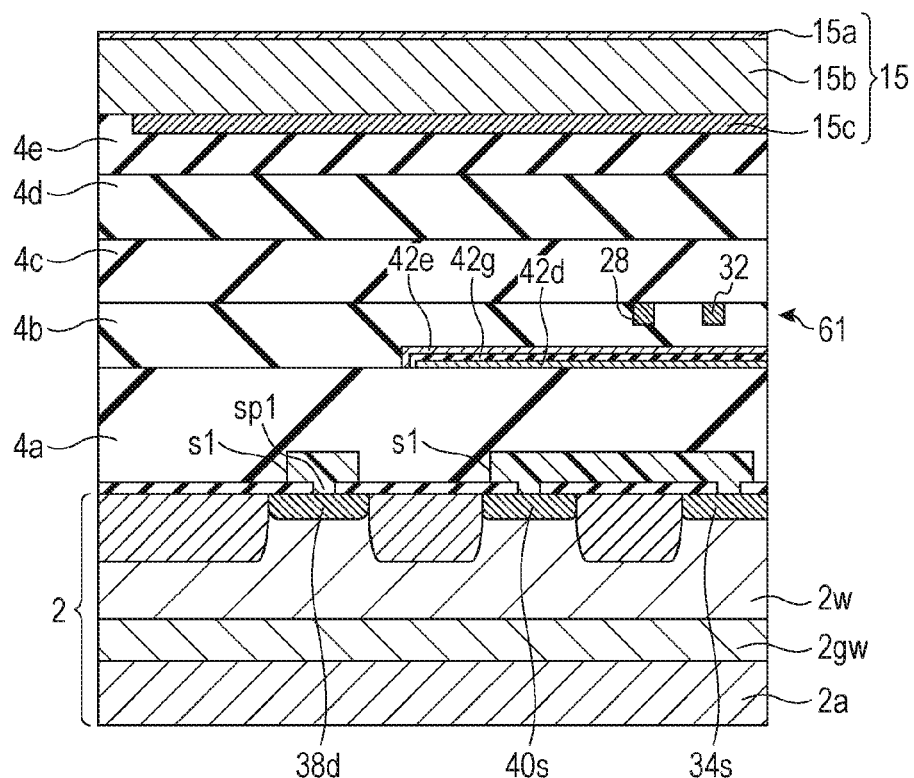
FIG. 5 is a schematic cross-sectional view taken along line V-V in FIG. 3.
Figure 6:
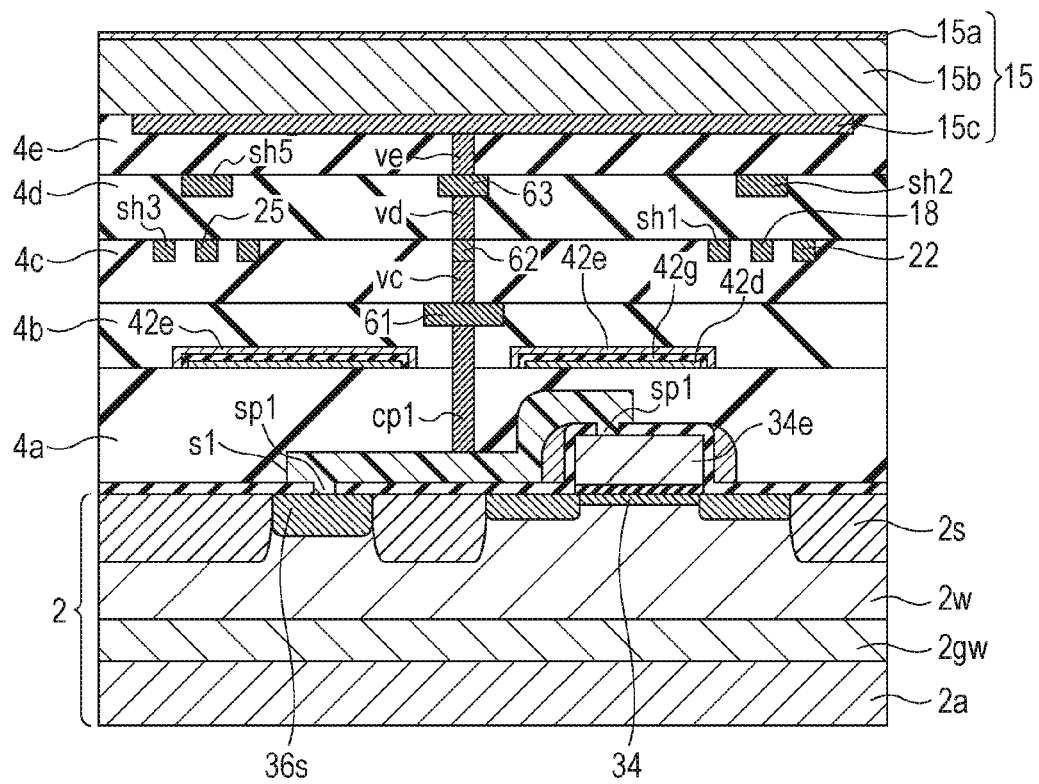
FIG. 6 is a schematic cross-sectional view taken along line VI-VI in FIG. 3.

FIG. 3 is a plan view schematically illustrating an example of the layout of some elements and some lines in the pixel 10. FIG. 4 is a schematic cross-sectional view illustrating a cross section of a connection between the reset drain node 46 and the amplification transistor 34. FIG. 5 is a schematic cross-sectional view illustrating a cross section of connections among the feedback transistor 38, address transistor 40, and amplification transistor 34. FIG. 6 is a schematic cross-sectional view illustrating a cross section of a connection between the reset transistor 36 and the amplification transistor 34.

The pixels 10 are placed on a semiconductor substrate. Now, an example will be described in which a P-type silicon (Si) substrate is used as a semiconductor substrate 2.

In this embodiment, four transistors, that is, the amplification transistor 34, reset transistor 36, feedback transistor 38, and address transistor 40, are placed in each pixel 10. Elements in the pixel 10 are separated by element separating areas 2s formed on the semiconductor substrate 2. In this example, a combination of the reset transistor 36 and feedback transistor 38 and a combination of the amplification transistor 34 and address transistor 40 are separated by separating areas 2s.

In this example, the amplification transistor 34, reset transistor 36, feedback transistor 38, and address transistor 40 are formed on the semiconductor substrate 2. The first capacitor 41 and second capacitor 42 are also formed on the semiconductor substrate 2. That is, in this example, the signal detection circuit SC is formed on the semiconductor substrate 2.

The reset drain node 46 is formed between the reset transistor 36 and the feedback transistor 38. The reset drain node 46 includes a diffusion layer 36d formed in the semiconductor substrate 2. The diffusion layer 36d is one of the source and drain of the feedback transistor 38. A diffusion layer 38d, which is the other of the source and drain of the feedback transistor 38, is connected to the feedback line 25 through a polysilicon plug sp1, a polysilicon layer s1, and a contact plug cp1. In the example illustrated in FIG. 4, the reset transistor 36 and feedback transistor 38 share the diffusion layer 36d as one of their source and drain.

As illustrated in FIG. 6, the gate electrode 34e of the amplification transistor 34 and the diffusion layer 36s, which is one of the source and drain of the reset transistor 36, are electrically connected together through the polysilicon layer s1. The polysilicon layer s1 is connected to the photoelectric converter 15 through a line. In this example, the charge accumulation region 44 includes the line, polysilicon layer s1, and diffusion layer 36s. The diffusion layer 36s has a function to accumulate charges (signal charges) generated in the photoelectric converter 15.

The pixel 10 has the photoelectric converter 15 on the semiconductor substrate 2. A first insulating layer 4a, a second insulating layer 4b, a third insulating layer 4c, a fourth insulating layer 4d, and a fifth insulating layer 4e are laminated on the semiconductor substrate 2. The insulating layers from the first insulating layer 4a to the fifth insulating layer 4e are each an inter-layer insulating layer. They are formed from, for example, silicon dioxide ($SiO_2$). A wiring layer 6 is placed between the semiconductor substrate 2 and the photoelectric converter 15. In the structure illustrated in FIG. 4, the wiring layer 6 has a multi-layer wiring structure that includes a first wiring layer 61, a second wiring layer 62 positioned closer to the photoelectric converter 15 than the first wiring layer 61 is, and a third wiring layer 63 positioned closed to the photoelectric converter 15 than the second wiring layer 62 is. The first wiring layer 61 is formed in the second insulating layer 4b. The second wiring layer 62 is formed in the third insulating layer 4c. The third wiring layer 63 is formed in the fourth insulating layer 4d. The reset signal line 26, feedback control line 28, address signal line 30, and other lines, described above, that extend in the row direction can be in the same layer as the first wiring layer 61. The vertical signal line 18 is a signal line through which an electric signal output from the amplification transistor 34 flows according to the amount of charge accumulated in the charge accumulation region 44. Each two wiring layers are electrically connected together by a via vc, a via vd, or via ve as illustrated in FIG. 6. The number of inter-layer insulating layers and the number of insulating layers can be set to any number. These numbers are not limited to the example in FIG. 6.

The photoelectric conversion film 15b of the photoelectric converter 15 is laminated on the fifth insulating layer 4e. The first electrode 15a is disposed on the light receiving surface 15h of the photoelectric conversion film 15b, light from a subject being incident on the light receiving surface 15h. The second electrode 15c is disposed on the surface, opposite to the light receiving surface 15h, of the photoelectric conversion film 15b. The second electrode 15c is electrically separated from among a plurality of pixels 10.

In the structure illustrated in FIG. 6, the feedback line 25 forming a feedback path across a plurality of pixels 10 is part of the wiring layer 6. In other words, the wiring layer 6 placed between the semiconductor substrate 2 and the photoelectric converter 15 includes at least part of the feedback line 25 within the pixel 10. The feedback line 25 extends across a plurality of pixels 10 and is part of the feedback circuit FC (see FIG. 2), forming a feedback path. In this example, the feedback line 25 is formed in the same layer as the second wiring layer 62. The second wiring layer 62 includes the vertical signal line 18.

When the feedback line 25 is disposed in a wiring layer included in the multi-layer structure other than the lowest layer as described above, coupling between the diffusion layer 36s and the feedback line 25 can be more effectively suppressed. In this specification, the lowest layer is the layer that is closest to the semiconductor substrate 2. The polysilicon layer s1 is also included in the lowest layer.

As illustrated in FIG. 6, shielding electrodes may be provided around the feedback line 25. In this specification, the shielding electrode is an electrode or a line to which a certain voltage is supplied at the time of operation. When shielding electrodes are provided around the feedback line 25, coupling between the diffusion layer 36s and the feedback line 25 can be more reduced. In the structure illustrated in FIG. 4, shielding electrodes sh3 and sh4, which are in the same layer as the second wiring layer 62, are provided to the left and right of the feedback line 25, respectively, and a shielding electrode sh5 is provide above the feedback line 25. These shielding electrodes are structured so as to be capable of supplying a certain voltage by being electrically connected to, for example, the vertical scanning circuit 16 (see FIG. 1) or a power supply circuit (not illustrated).

In the structures illustrated in FIGS. 4 to 6, the semiconductor substrate 2 has a support substrate 2a, a well 2w, an impurity layer 2gw, and a diffusion layer 36s. The well 2w has a relatively high acceptor concentration. In this example, the well 2w is a P-type area. The impurity layer 2gw is an area the conductive type of which is opposite to the conductive type of the well 2w. In this example, the impurity layer 2gw is an N-type area and the diffusion layer 36s is also an N-type area. The support substrate 2a and well 2w are electrically connected together by a connection area (not illustrated) formed in the impurity layer 2gw. The connection area is an impurity area the conductive type of which is the same as the conductive type of the well 2w. When a plug formed from polysilicon is used as a contact with the diffusion layer 36s, this is advantageous in that dark current can be suppressed. This is because an influence of a crystal defect attributable to a metal-semiconductor interface, which would otherwise be caused when a metal plug is used, can be avoided. In the structure illustrated in FIG. 6, the polysilicon layer s1 and the gate electrode 34e of the amplification transistor 34 are electrically connected together through the polysilicon plug sp1.

In FIG. 4, the amplification transistor 34 includes a diffusion layer 34s and a diffusion layer 34d, which respectively form a source and a drain, a gate insulating layer 34g formed on the semiconductor substrate 2, and a gate electrode 34e formed on the gate insulating layer 34g. Typically, the gate insulating layer 34g is a silicon dioxide film. In this example, the gate electrode 34e is formed from polysilicon. The gate insulating layer 34g, the gate electrode 34e, and a channel area 34c formed between the diffusion layer 34s and the diffusion layer 34d are indicated. The channel area 34c may be an area in which an acceptor or donor has been ion-implanted under a predetermined implantation condition. By performing ion-implantation, a desired threshold voltage can be achieved in the amplification transistor 34. The reset transistor 36, feedback transistor 38, and address transistor 40 may also have almost the same structure as the amplification transistor 34.

As illustrated in FIG. 4, the second capacitor 42 includes a lower electrode 42d, an insulating layer 42g disposed on the lower electrode 42d, and an upper electrode 42e disposed on the insulating layer 42g. The insulating layer 42g is formed from, for example, a highly dielectric film such as a hafnium dioxide ($HfO_2$) film or a nitride film. The lower electrode 42d is electrically connected to the diffusion layer 36d. In the embodiments in the present disclosure, the second capacitor 42 is a so-called a metal-insulator-metal (MIM) capacitor. The upper electrode 42e is electrically connected to the sensitivity adjustment line 32 (see FIGS. 2 and 5). A predetermined voltage is applied to the upper electrode 42e from a voltage source through the sensitivity adjustment line 32. In this example, the voltage source is the vertical scanning circuit 16. When the potential of the upper electrode 42e is controlled, the potential of the charge accumulation region 44 can be controlled. In other words, when a voltage supplied to the upper electrode 42e through the sensitivity adjustment line 32 is adjusted, the sensitivity of the imaging device 100 can be adjusted. In addition, when a certain voltage is supplied to the upper electrode 42e, the potential of the upper electrode 42e can be held at a certain potential. Accordingly, it is possible to make the upper electrode 42e of the second capacitor 42 having a relatively large capacitance value function as a shielding electrode.

In the structure illustrated in FIG. 4, the first capacitor 41 is composed of an upper electrode 41w, the gate electrode 34e of the amplification transistor 34, and an insulating film 41g sandwiched between the upper electrode 41w and the gate electrode 34e. The upper electrode 41w is formed from the polysilicon layer s1. The upper electrode 41w and reset drain node 46 are connected together through the polysilicon plug sp1, the polysilicon layer s1, the contact plug cp1, and a connection line 71. The connection line 71 is formed in the same layer as the first wiring layer 61. The connection line 71 is formed from a metal such as copper. The connection line 71 is formed for each pixel 10 without extending across the adjacent pixels 10. The connection line 71 is disposed so as to be closer to the photoelectric converter 15 than the second capacitor 42 is and closer to the semiconductor substrate 2 than the second wiring layer 62 is. The contact plug cp1 passes through a hole formed in the second capacitor 42.

The insulating film 41g may be part of an inter-layer insulating film. At least part of the upper electrode 41w overlaps the gate electrode 34e when viewed from the direction of the normal of the semiconductor substrate 2. The upper electrode 41w is connected to the lower electrode 42d of the second capacitor 42. The gate electrode 34e is electrically connected to the second electrode 15c through the polysilicon plug sp1, polysilicon layer s1, contact plug cp1, first wiring layer 61, via vc, second wiring layer 62, via vd, third wiring layer 63, and via ve. Typically, the contact plug cp1, first wiring layer 61, second wiring layer 62, third wiring layer 63, and vias vc to ve are formed from a metal. The polysilicon plug sp1, gate electrode 34e, contact plug cp1, first wiring layer 61, second wiring layer 62, third wiring layer 63, vias vc to ve, and diffusion layer 36s accumulate charges generated in the photoelectric converter 15.

In the structure illustrated in FIG. 6, the second capacitor 42 may be disposed below the feedback line 25. As illustrated in FIG. 6, when at least the upper electrode 42e of the second capacitor 42 is disposed below the feedback line 25, coupling between the diffusion layer 36s and the feedback line 25 can be reduced. Thus, crosstalk attributable to coupling between the diffusion layer 36s and the feedback line 25 can be more reduced. This can more reduce the influence of noise on the imaging device 100.

As illustrated in FIG. 5, the polysilicon layer s1 is used to connect the amplification transistor 34, which is part of the feedback path, and the address transistor 40 together. Specifically, the diffusion layer 34s and a diffusion layer 40s are connected together by using the polysilicon layer s1. That is, the connection portion between the diffusion layer 34s and the diffusion layer 40s is disposed so as to be closer to the semiconductor substrate 2 than the first wiring layer 61 is and so as to be on the semiconductor substrate 2 side of the second capacitor 42.

In the circuit structure illustrated in FIG. 2, pixels 10 are selected on a per-row basis, after which an operation to cancel noise is executed. That is, in noise cancellation, one of pixels 10 arranged in the column direction is typically selected in succession. However, when a plurality of feedback lines are placed for each column of pixels 10 to select two or more rows, it is also possible to concurrently execute noise cancellation for the selected rows. In this structure, noise cancellation can be completed at higher speed. In an example in which two feedback lines are placed for each column of pixels 10, if pixels 10 in an odd-numbered row are connected to one of the two feedback lines and pixels 10 in an even-numbered row are connected to the other, an operation to cancel noise can be executed for two rows at a time. Thus, the number of feedback lines 25 in the pixel 10 is not limited to 1.

Figure 29:
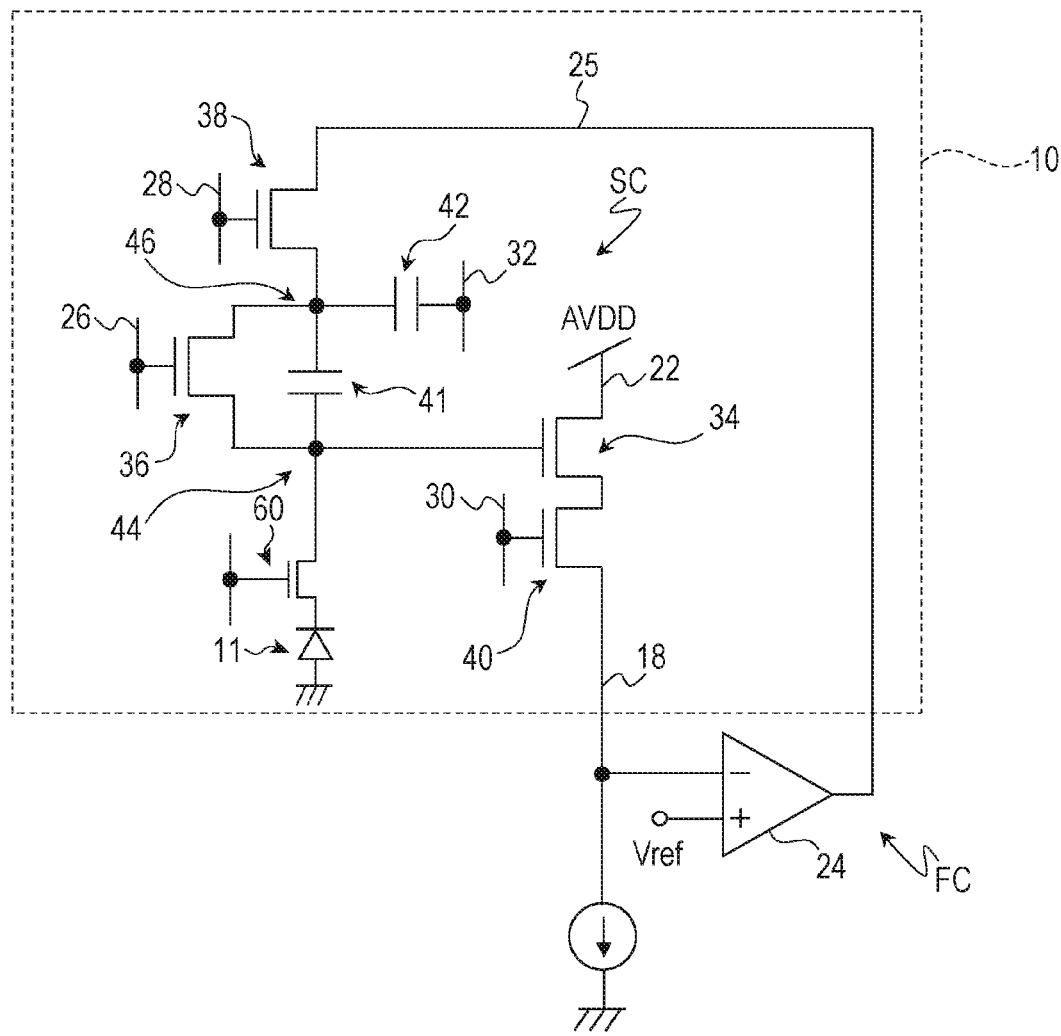
FIG. 29 schematically illustrates another exemplary circuit structure of the pixel according to the first embodiment.

In this embodiment, the photoelectric converter 15 may be a photodiode. FIG. 29 schematically illustrates another exemplary circuit structure of the pixel 10 according to this embodiment. As illustrated in FIG. 29, a photodiode 11 may be used as the photoelectric converter 15. The photodiode 11 may be an embedded photodiode formed in the semiconductor substrate 2. A transfer transistor 60 may be provided between the photoelectric converter 15 and the charge accumulation region 44. Even in a circuit structure in which the photodiode 11 is used as the photoelectric converter 15, the charge accumulation region 44 is electrically connected to the photoelectric converter 15 through the transfer transistor 60. That is, the charge accumulation region 44 is electrically connected to the photoelectric converter 15.

Second Embodiment

Figure 7:
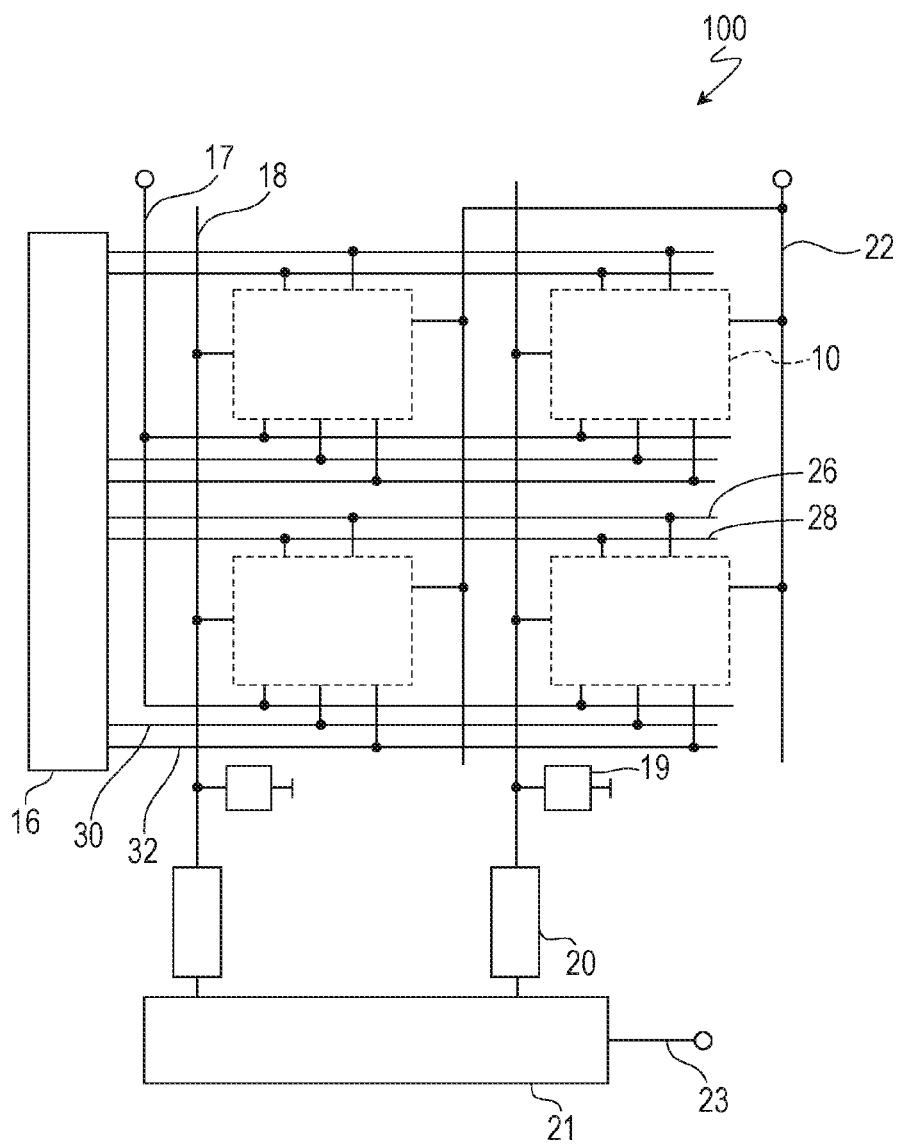
FIG. 7 schematically illustrates an exemplary circuit structure of an imaging device according to a second embodiment.
Figure 8:
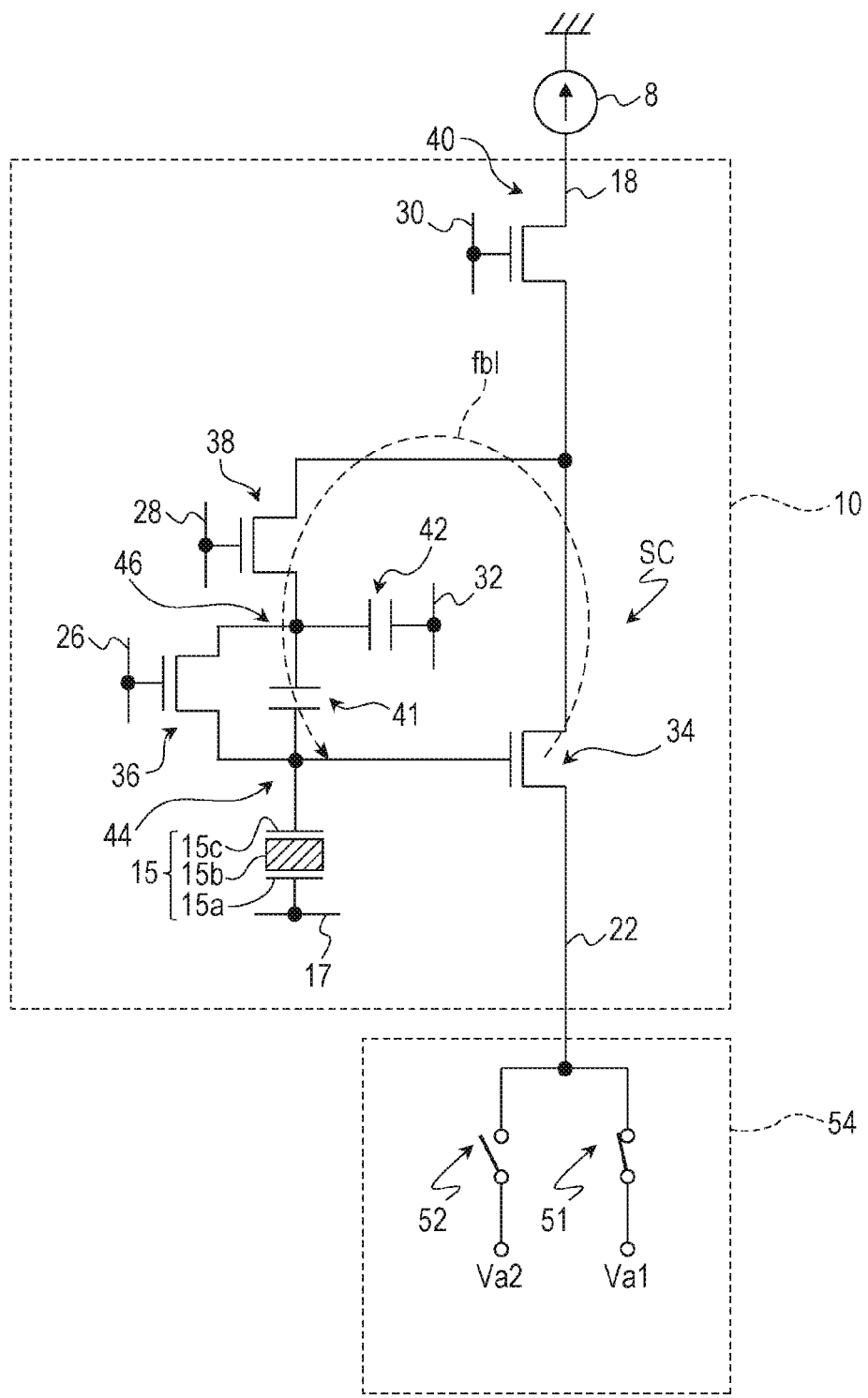
FIG. 8 schematically illustrates an exemplary circuit structure of a pixel in the imaging device in FIG. 7.

FIG. 7 schematically illustrates an exemplary circuit structure of the imaging device 100 according to a second embodiment. FIG. 8 schematically illustrates an exemplary circuit structure of the pixel 10 in the imaging device 100 in FIG. 7.

The second embodiment differs from the first embodiment in that each pixel 10 has a feedback path fb1. In the second embodiment, the same description as in the first embodiment will be omitted.

As illustrated in FIG. 8, the pixel 10 in the imaging device 100 in the second embodiment has a signal detection circuit SC. The signal detection circuit SC includes the feedback path fb1. The signal detection circuit SC also includes the amplification transistor 34. The gate of the amplification transistor 34 is connected to the second electrode 15c of the photoelectric converter 15. One of the source and drain of the amplification transistor 34 is connected to the power supply line 22, and the other is connected to the vertical signal line 18 through the address transistor 40. An electric signal output from the amplification transistor 34 is transferred through the vertical signal line 18. That is, the vertical signal line 18 is a signal line used to read out a signal in the signal detection circuit SC. Typically, the vertical signal line 18 is an output line in the signal detection circuit SC. In this example, the vertical signal line 18 is electrically connected to one of the source and drain of the reset transistor 36 through the feedback transistor 38.

As illustrated in FIG. 8, in the second embodiment, one of the source and drain of the feedback transistor 38 and either terminal of the amplification transistor 34, source or drain, which is connected to the vertical signal line 18, are connected together. That is, a feedback path is formed for each pixel 10. The feedback path fb1, which negatively feeds back an output from the amplification transistor 34 to the feedback transistor 38, is also formed. In other words, in the second embodiment, a signal created by the photoelectric converter 15 is negatively fed back to the feedback transistor 38 through the amplification transistor 34. In the second embodiment, the feedback path fb1 does not extend across a plurality of pixels 10. In the structure illustrated in FIG. 8, an output from the amplification transistor 34 is used as a reference voltage in the resetting of the charge accumulation region 44. In this specification, the feedback path fb1 is a path extending from the charge accumulation region 44 through the amplification transistor 34, feedback transistor 38, and first capacitor 41 or reset transistor 36 to the charge accumulation region 44.

In the second embodiment, feedback for noise cancelation can be executed in each pixel 10. Thus, noise cancellation can be executed at high speed without being affected by the time-constant of the vertical signal line 18. In the circuit structure illustrated in FIG. 8, an output voltage from the amplification transistor 34 is applied to the reset transistor 36. This type of circuit can reduce a change in the voltage in the charge accumulation region 44 before and after the reset transistor 36 is turned off, so noise can be suppressed at higher speed.

In the structure illustrated in FIG. 8, a voltage switching circuit 54 is connected to the power supply line 22. The voltage switching circuit 54 has a combination of a first switch 51 and a second switch 52. The voltage switching circuit 54 makes a switchover to select either of a first voltage Va1 and a second voltage Va2 as a voltage to be supplied to the power supply line 22. The first voltage Va1 is, for example, 0 V (ground), and the second voltage Va2 is, for example, a power supply voltage. The voltage switching circuit 54 may be provided for each pixel 10 or may be shared by a plurality of pixels 10. In this type of circuit structure as well, the influence of kTC noise can be reduced as in the first embodiment.

Specifically, a constant-current source 8 is connected to the vertical signal line 18. With the address transistor 40 turned on, a source follower circuit is formed by the address transistor 40, the amplification transistor 34, and a constant-current source 8. A signal is output to the vertical signal line 18 according to signal charges accumulated in the charge accumulation region 44, after which the signal is externally read out. The constant-current source 8 may be provided for each pixel 10 or may be shared by a plurality of pixels 10 to reduce the number of elements in one pixel 10.

To reset the charge accumulation region 44, the address transistor 40 is turned off and the amplification transistor 34 and vertical signal line 18 are electrically disconnected from each other. Then, the feedback transistor 38 is turned on, and the first switch 51 of the voltage switching circuit 54 is turned on. That is, the first voltage Va1 is applied to either terminal of the amplification transistor 34, source or drain, which is not connected to the power supply line 18. When the reset transistor 36 is then turned on, the charge accumulation region 44 is reset and the voltage of the charge accumulation region 44 becomes a reference voltage VR2.

Next, the reset transistor 36 is turned off. At that time, the signal detection circuit SC has a feedback circuit with a gain of $-A \times B$ times. Therefore, kTC noise, in the charge accumulation region 44, that is generated when the reset transistor 36 is turned off is suppressed to $1/(1+A \times B)$ times. In this way, kTC noise can be suppressed.

In a noise suppression period, the voltage of the feedback control line 28 is set to a voltage between a high level and a low level such as, for example, an intermediate voltage. In this case, the operation band of the feedback transistor 38 is a second band, which is narrower than a first band.

In a state in which the second band is narrower than the operation band of the amplification transistor 34, thermal noise generated in the feedback transistor 38 is suppressed to $1/(1+A \times B)^{1/2}$ times by the feedback path fb1. In this state, the voltage of the feedback control line 28 is set to the low level to turn off the feedback transistor 38. Then, kTC noise remaining in the charge accumulation region 44 at that time becomes the sum of the squares of kTC noise attributable to the reset transistor 36 and kTC noise attributable to the feedback transistor 38.

Now, the capacitance of the first capacitor 41 is assumed to be Cs and the capacitance of the charge accumulation region 44 is assumed to be CFD. Then, kTC noise generated by the feedback transistor 38 when there is no suppression due to feedback is $(CFD/Cs)^{1/2}$ times kTC noise generated by the reset transistor 36 when there is no suppression due to feedback. In view of this, kTC noise when there is feedback is suppressed to $\{1+(1+A \times B) \times CFD/Cs\}^{1/2}/(1+A \times B)$ times kTC noise when there is no feedback.

In an exposure/read-out period, the voltage of the address signal line 30 is set to the high level to turn on the address transistor 40 and the voltage switching circuit 54 is controlled so that the voltage of the other of the source and drain of the amplification transistor 34 becomes Va2. In this state, the amplification transistor 34 and constant-current source 8 form a source follower circuit. The voltage of the vertical signal line 18 becomes at a level corresponding to signal charges accumulated in the charge accumulation region 44. At that time, the gain of the source follower circuit is about 1 time.

The voltage of the charge accumulation region 44 changes from VR2 by an amount corresponding to an electric signal created by the photoelectric converter 15. The voltage of the charge accumulation region 44 is output to the vertical signal line 18 with a gain of about 1 time.

Random noise indicates a fluctuation in an output when no signal charge is generated in the photoelectric converter 15. That is, random noise indicates kTC noise. In noise suppression period, kTC noise is suppressed to $\{1+(1+A\times B)\times CFD/Cs\}^{1/2}/(1+A\times B)$ times. In the exposure/read-out period, a signal with a gain of about 1 time is output to the vertical signal line 18. As a result, superior image data with random noise suppressed can be captured.

Figure 9:
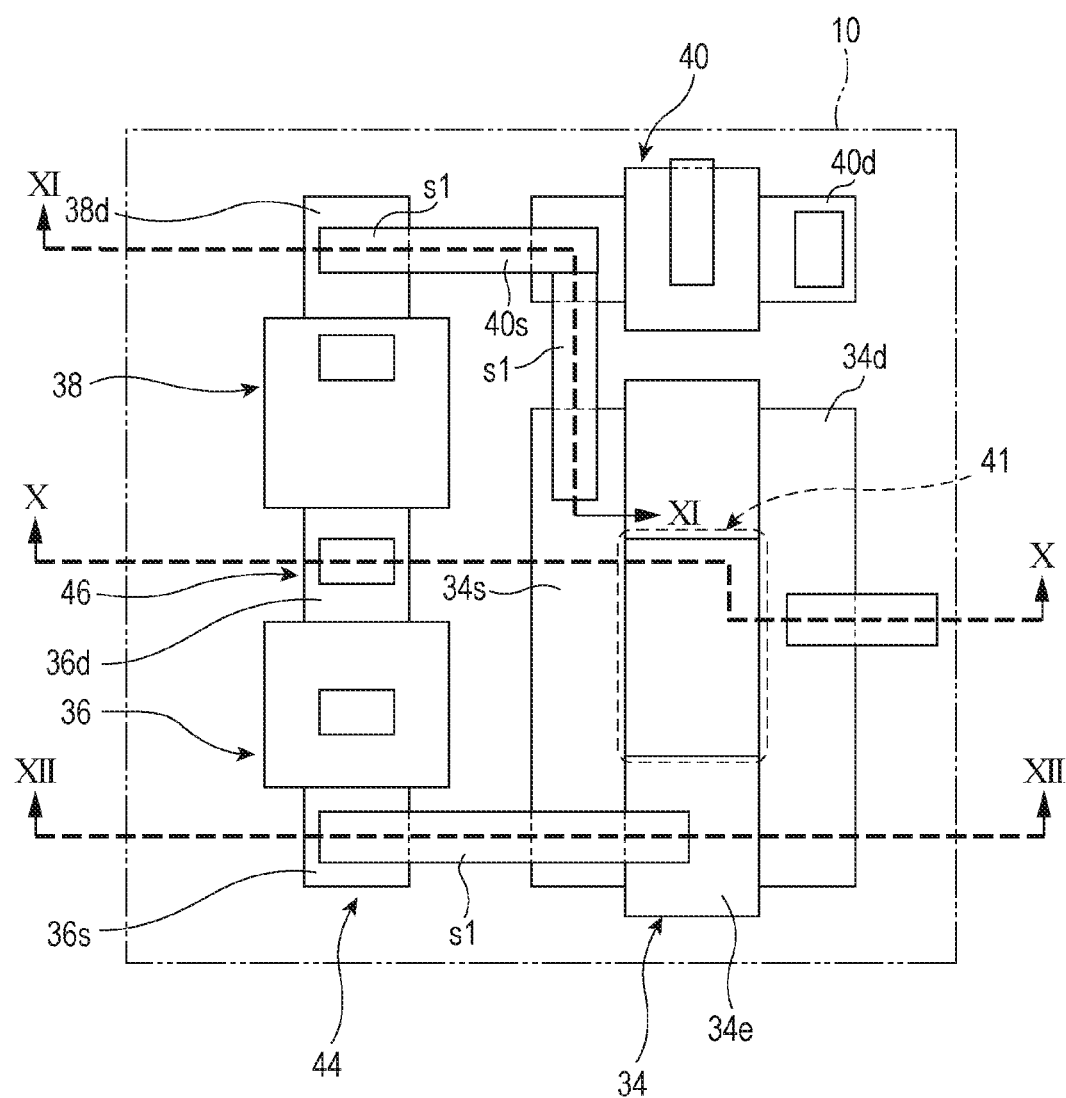
FIG. 9 is a plan view schematically illustrating an example of the layout of some elements and some lines in the pixel according to the second embodiment.
Figure 10:
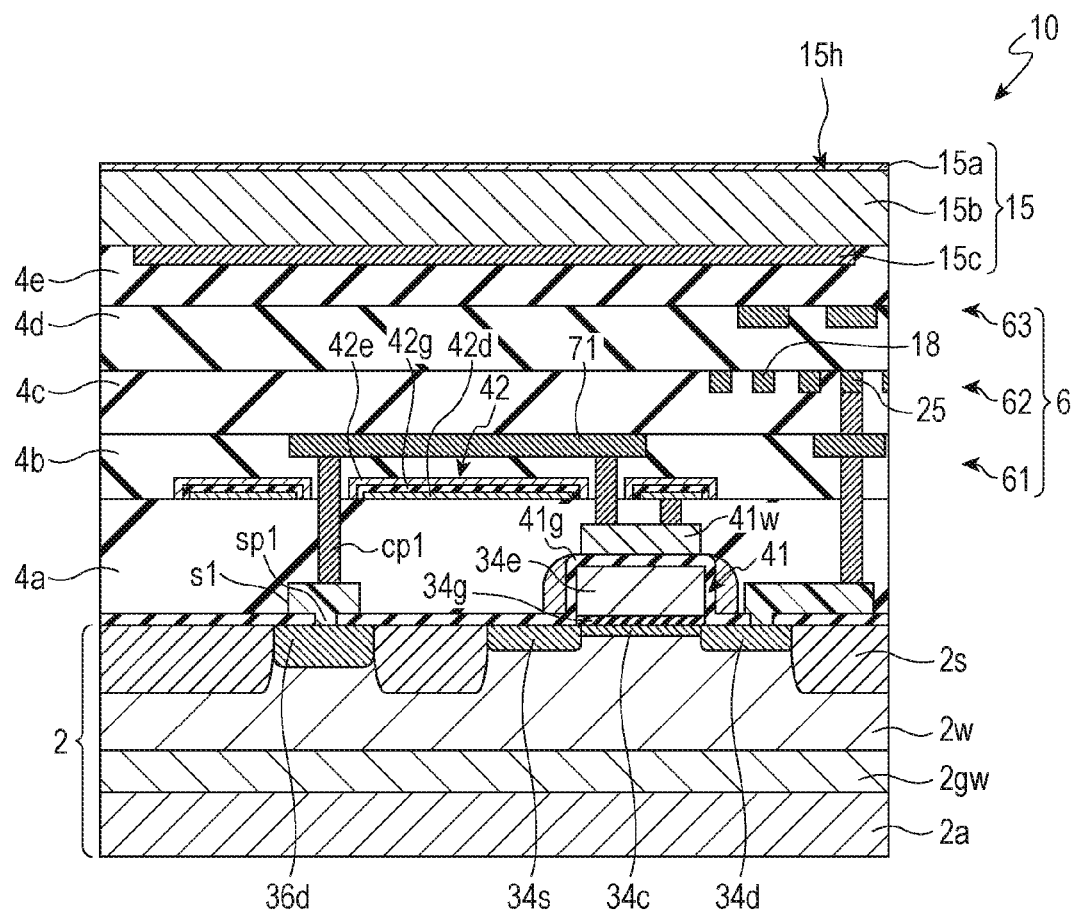
FIG. 10 is a schematic cross-sectional view taken along line X-X in FIG. 9.
Figure 11:
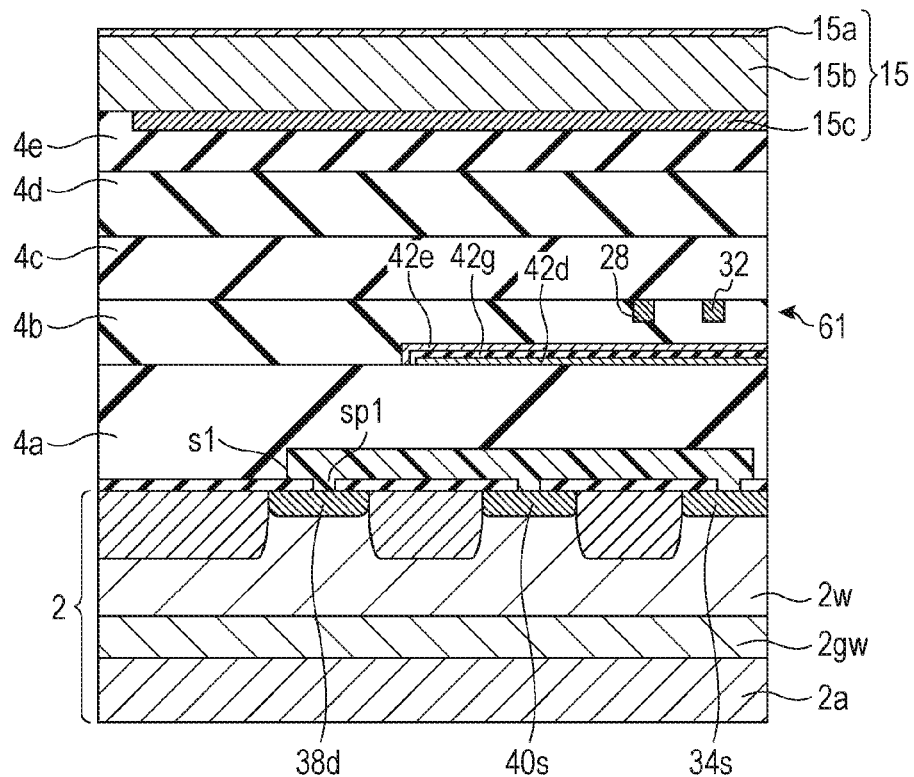
FIG. 11 is a schematic cross-sectional view taken along line XI-XI in FIG. 9.
Figure 12:
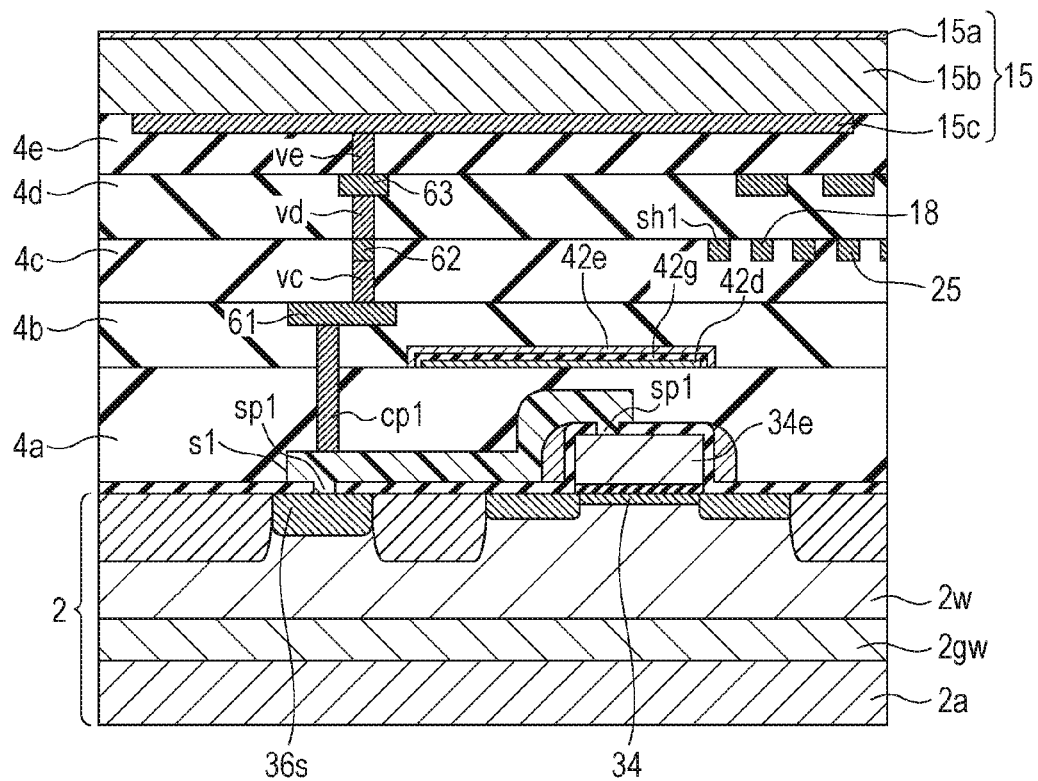
FIG. 12 is a schematic cross-sectional view taken along line XII-XII in FIG. 9.

FIG. 9 is a plan view schematically illustrating an example of the layout of some elements and some lines in the pixel 10 according to the second embodiment. FIG. 10 is a schematic cross-sectional view illustrating a cross section of a connection between the reset drain node 46 and the amplification transistor 34. FIG. 11 is a schematic cross-sectional view illustrating a cross section of connections among the feedback transistor 38, address transistor 40, and amplification transistor 34. FIG. 12 is a schematic cross-sectional view illustrating a cross section of a connection between the reset transistor 36 and the amplification transistor 34.

As illustrated in FIG. 9 and FIGS. 10 to 12, the feedback path fb1 is formed in a layer closer to the semiconductor substrate 2 (lower layer) than the second wiring layer 62 is. The second wiring layer 62 includes the vertical signal line 18 and feedback line 25. Both the vertical signal line 18 and the feedback line 25 are formed so as to extend across a plurality of pixels 10. The address transistor 40 has the diffusion layer 40s and a diffusion layer 40d as its source and drain, respectively. The diffusion layer 40s is connected to the diffusion layer 34s, which is one of the source and drain of the amplification transistor 34.

Specifically, as illustrated in FIG. 10, the diffusion layer 36d and first capacitor 41 are connected together through the polysilicon plug sp1, polysilicon layer s1, contact plug cp1, and connection line 71. The connection line 71 is formed in the same layer as the first wiring layer 61. The connection line 71 is formed from a metal such as copper. The connection line 71 is formed for each pixel 10 without extending across the adjacent pixels 10. The connection line 71 is disposed so as to be closer to the photoelectric converter 15 than the second capacitor 42 is and closer to the semiconductor substrate 2 than the second wiring layer 62 is. The contact plug cp1 passes through a hole formed in the second capacitor 42.

As illustrated in FIG. 11, the diffusion layer 38d, which is used as one of the source and drain of the feedback transistor 38, and the diffusion layer 40s, which is used as one of the source and drain of the address transistor 40, are connected together through the polysilicon layer s1. Similarly, the diffusion layer 40s of the address transistor 40 and the diffusion layer 34s of the amplification transistor 34 are connected together through the polysilicon layer s1. The polysilicon layer s1 is disposed so as to be closer to the semiconductor substrate 2 than the second wiring layer 62 is and closer to the semiconductor substrate 2 than the first wiring layer 61 is.

As illustrated in FIG. 12, the gate electrode 34e of the amplification transistor 34 and the diffusion layer 36s, which is used as one of the source and drain of the reset transistor 36, are electrically connected together through the polysilicon layer s1. The polysilicon layer s1 is connected to the photoelectric converter 15 through a line. The polysilicon layer s1 is disposed so as to be closer to the semiconductor substrate 2 than the first wiring layer 61 is.

In the second embodiment, noise cancellation is executed for each pixel 10. Since the feedback path fb1 is electrically connected to the vertical signal line 18, noise that has entered the vertical signal line 18 may influence the voltage of the diffusion layer 36s. Therefore, it is advantageous to suppress coupling between the diffusion layer 36s and the vertical signal line 18. In the second embodiment, the feedback path fb1 is formed in the polysilicon layer s1 within the pixel 10, so the feedback path fb1 is disposed in a layer below the vertical signal line 18. This suppresses coupling between the vertical signal line 18 and the diffusion layer 36s, preventing crosstalk attributable to coupling. Therefore, it is possible to reduce the influence of noise in the imaging device 100.

Figure 30:
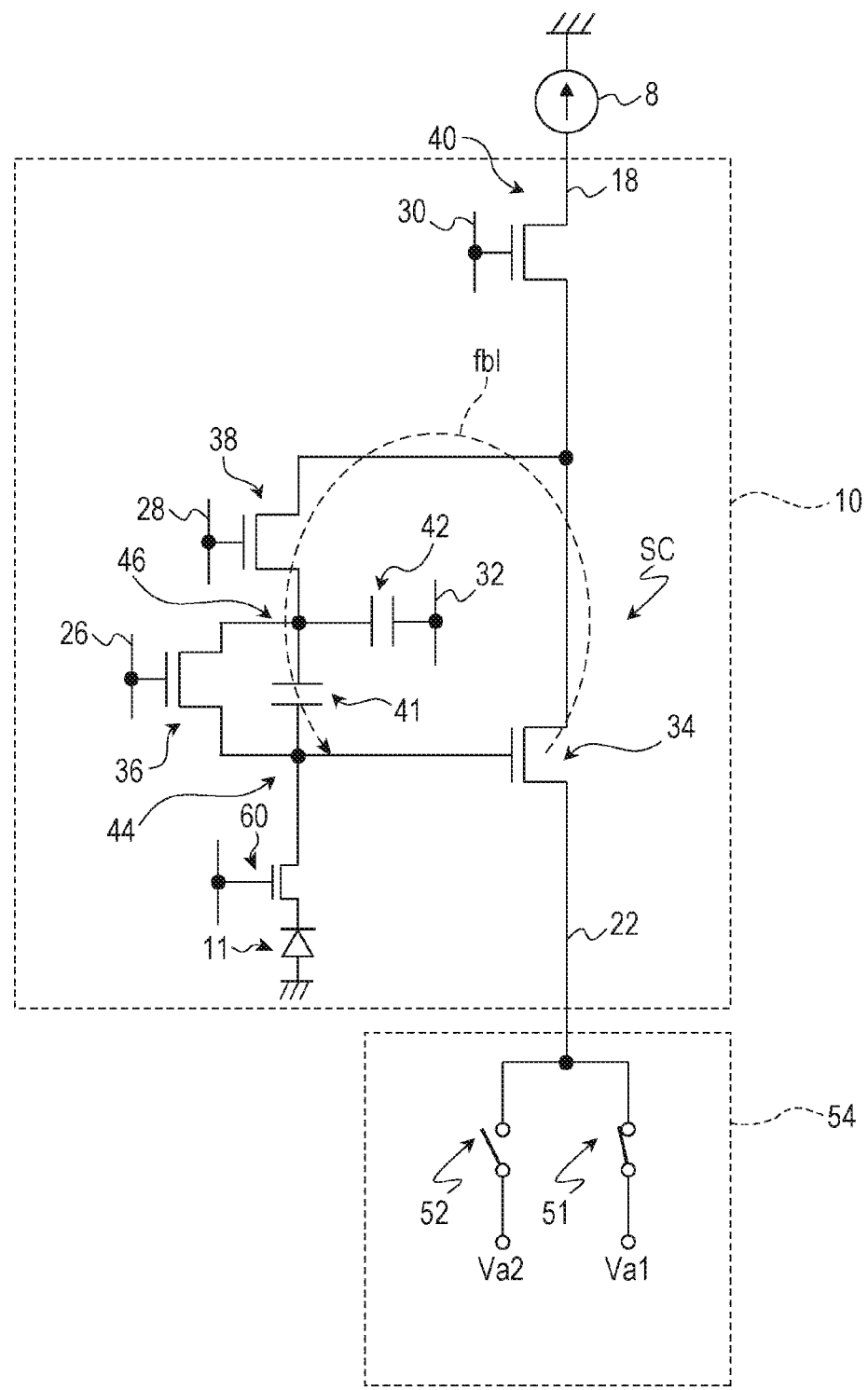
FIG. 30 schematically illustrates another exemplary circuit structure of the pixel in the imaging device in FIG. 7.

In this embodiment, the photoelectric converter 15 may be a photodiode. FIG. 30 schematically illustrates another exemplary circuit structure of the pixel 10 in the imaging device 100 in FIG. 7. As illustrated in FIG. 30, the photodiode 11 may be used as the photoelectric converter 15. The photodiode 11 may be an embedded photodiode formed in the semiconductor substrate 2. The transfer transistor 60 may be provided between the photoelectric converter 15 and the charge accumulation region 44. Even in a circuit structure in which the photodiode 11 is used as the photoelectric converter 15, the charge accumulation region 44 is electrically connected to the photoelectric converter 15 through the transfer transistor 60. That is, the charge accumulation region 44 is electrically connected to the photoelectric converter 15. In embodiments described below as well, a circuit structure in which the photodiode 11 is used as the photoelectric converter 15 may be formed similarly.

Third Embodiment

Next, another embodiment of the imaging device 100 will be described. Portions having an effect, function, shape, mechanism, or structure similar to that in the first and second embodiment described above are assigned the same reference characters, and these portions may not be described. The description below will focus on different points from the first and second embodiments, and repeated descriptions may be omitted.

Figure 13:
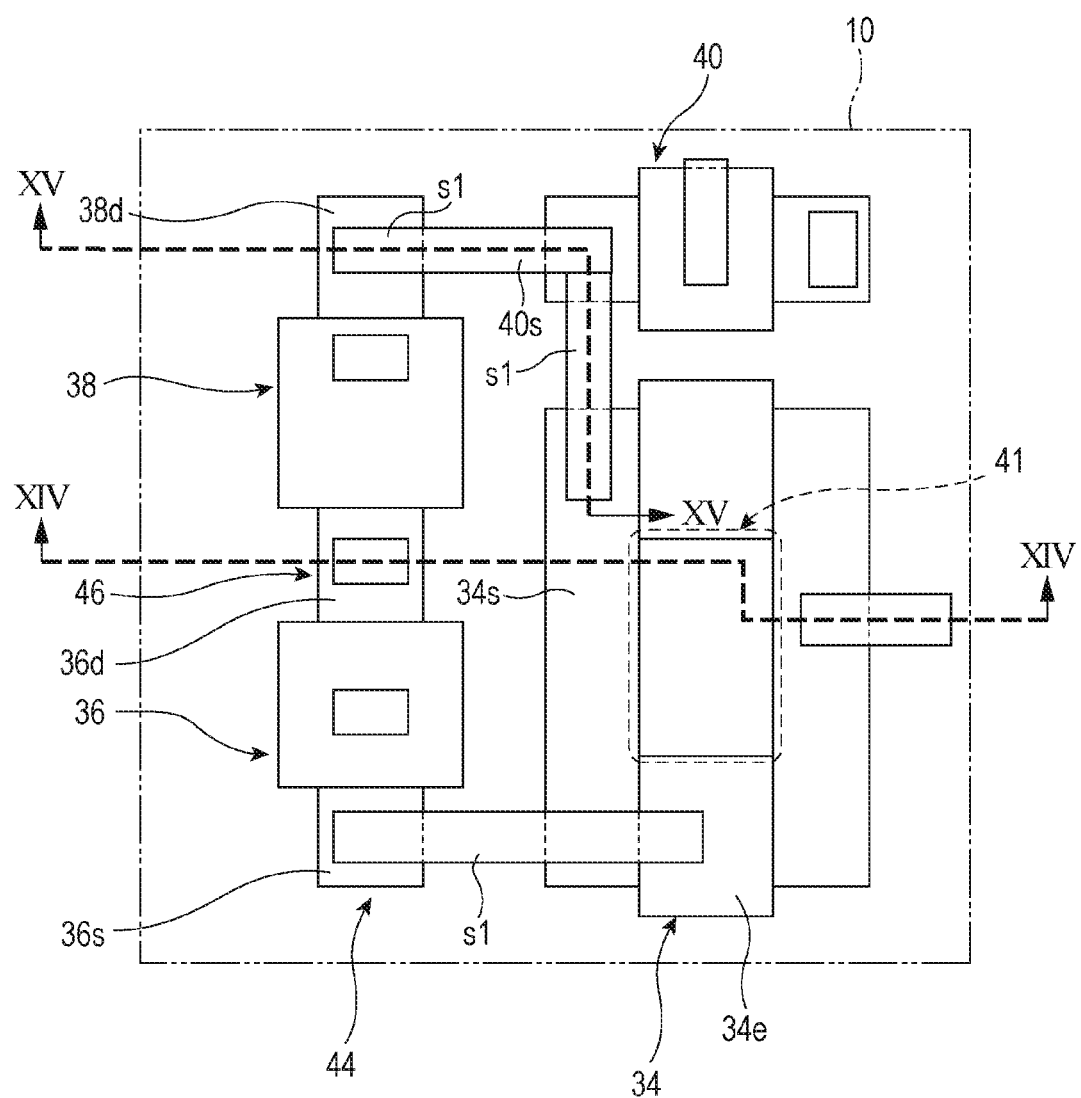
FIG. 13 is a plan view schematically illustrating an example of the layout of some elements and some lines in a pixel according to a third embodiment.
Figure 14:
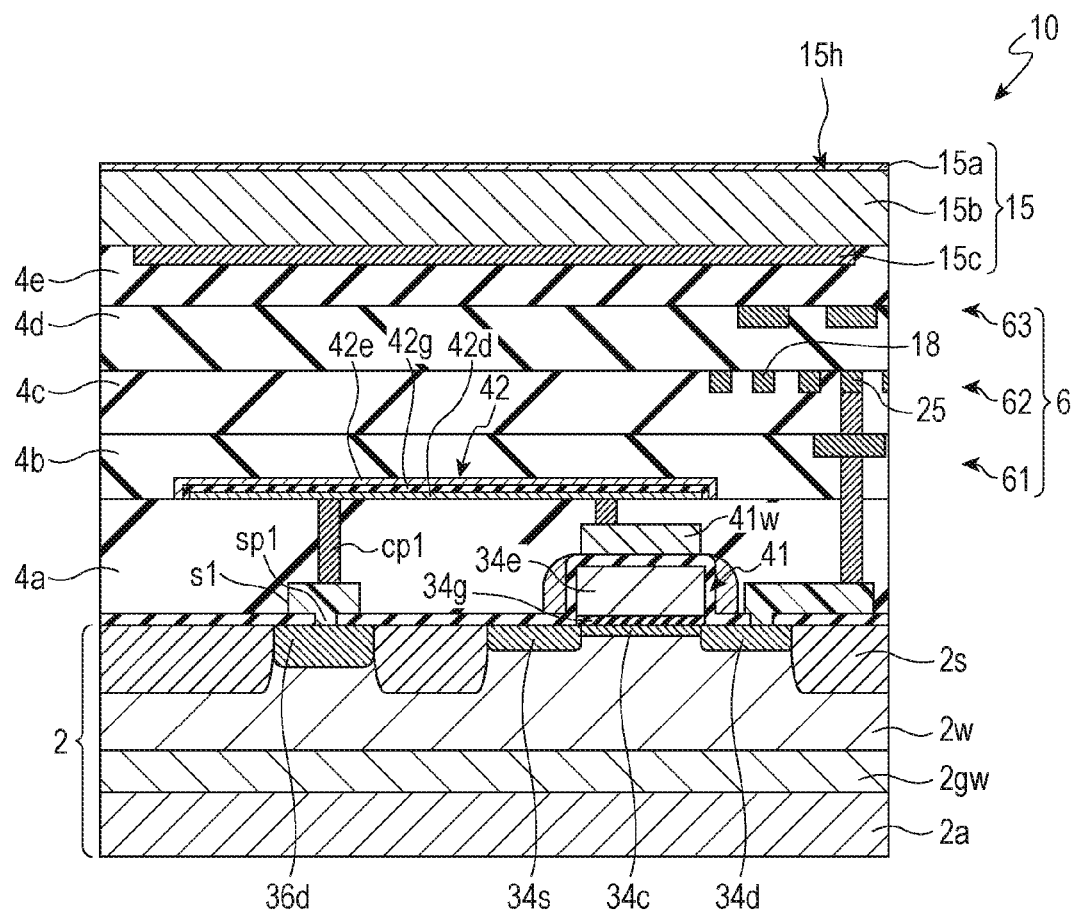
FIG. 14 is a schematic cross-sectional view taken along line XIV-XIV in FIG. 13.
Figure 15:
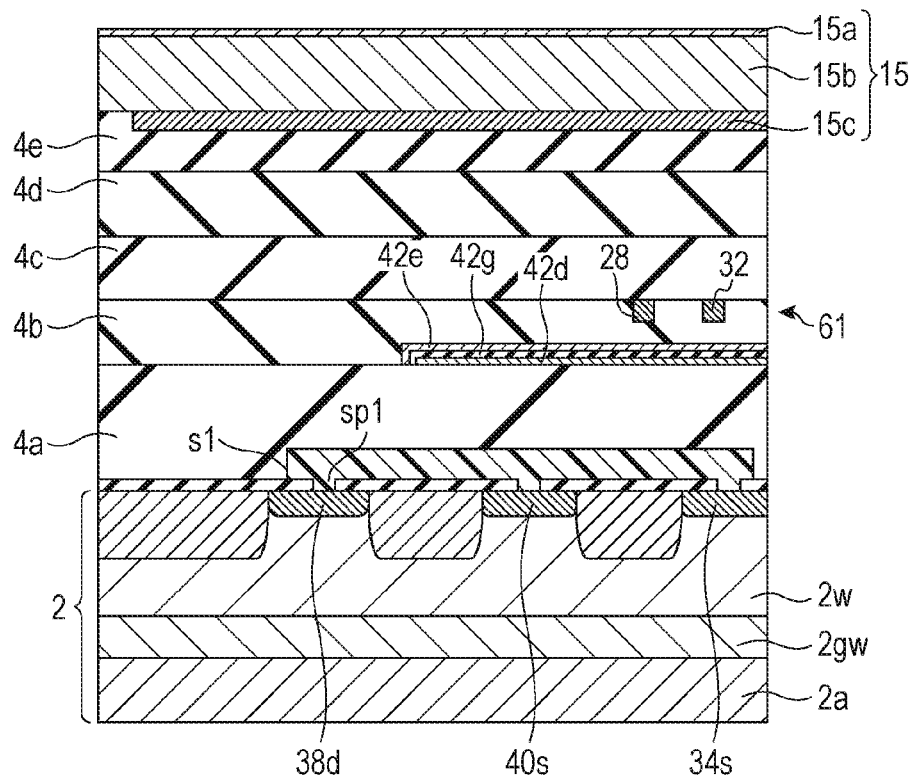
FIG. 15 is a schematic cross-sectional view taken along line XV-XV in FIG. 13.

FIG. 13 is a plan view schematically illustrating an example of the layout of some elements and some lines in the pixel 10 according to a third embodiment. FIG. 14 is a schematic cross-sectional view illustrating a cross section of a connection between the reset drain node 46 and the amplification transistor 34. FIG. 15 is a schematic cross-sectional view illustrating a cross section of connections among the feedback transistor 38, address transistor 40, and amplification transistor 34 in the third embodiment.

In the third embodiment, a method of connecting the diffusion layer 36d and first capacitor 41 together differs from the second embodiment. Specifically, as illustrated in FIG. 14, the diffusion layer 36d and the first capacitor 41 are connected together by using lower electrode 42d of the second capacitor 42. The lower electrode 42d is formed in the second insulating layer 4b, which is closer to the semiconductor substrate 2 than the second wiring layer 62 is.

As illustrated in FIG. 15, the diffusion layer 38d of the feedback transistor 38, the diffusion layer 40s of the address transistor 40, and the diffusion layer 34s of the amplification transistor 34 are connected together through the polysilicon layer s1. The form of this connection is the same as in the second embodiment.

In the third embodiment as well, effects similar to those in the second embodiment are obtained.

In the third embodiment, the diffusion layer 36d and first capacitor 41 are connected together by using the lower electrode 42d of the second capacitor 42. This eliminates the need to separately prepare a line passing through the second capacitor 42, so the area of the second capacitor 42 can be enlarged. Therefore, the dynamic range in imaging can be widened.

Fourth Embodiment

Next, another embodiment of the imaging device 100 will be described. Portions having an effect, function, shape, mechanism, or structure similar to that in the first, second, and third embodiments described above are assigned the same reference characters, and these portions may not be described. The description below will focus on different points from the first, second, and third embodiments, and repeated descriptions may be omitted.

Figure 16:
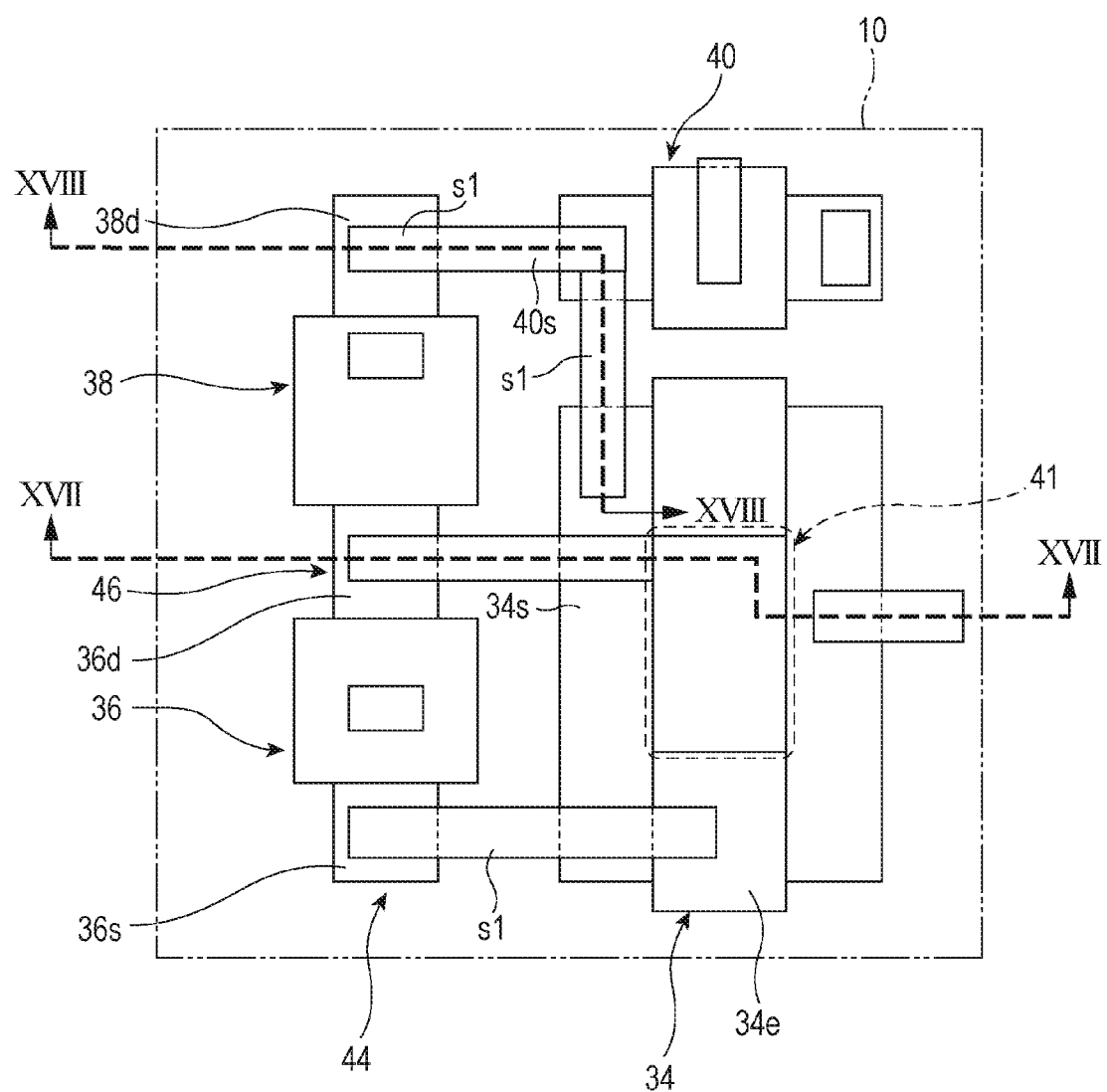
FIG. 16 is a plan view schematically illustrating an example of the layout of some elements and some lines in a pixel according to a fourth embodiment.
Figure 17:
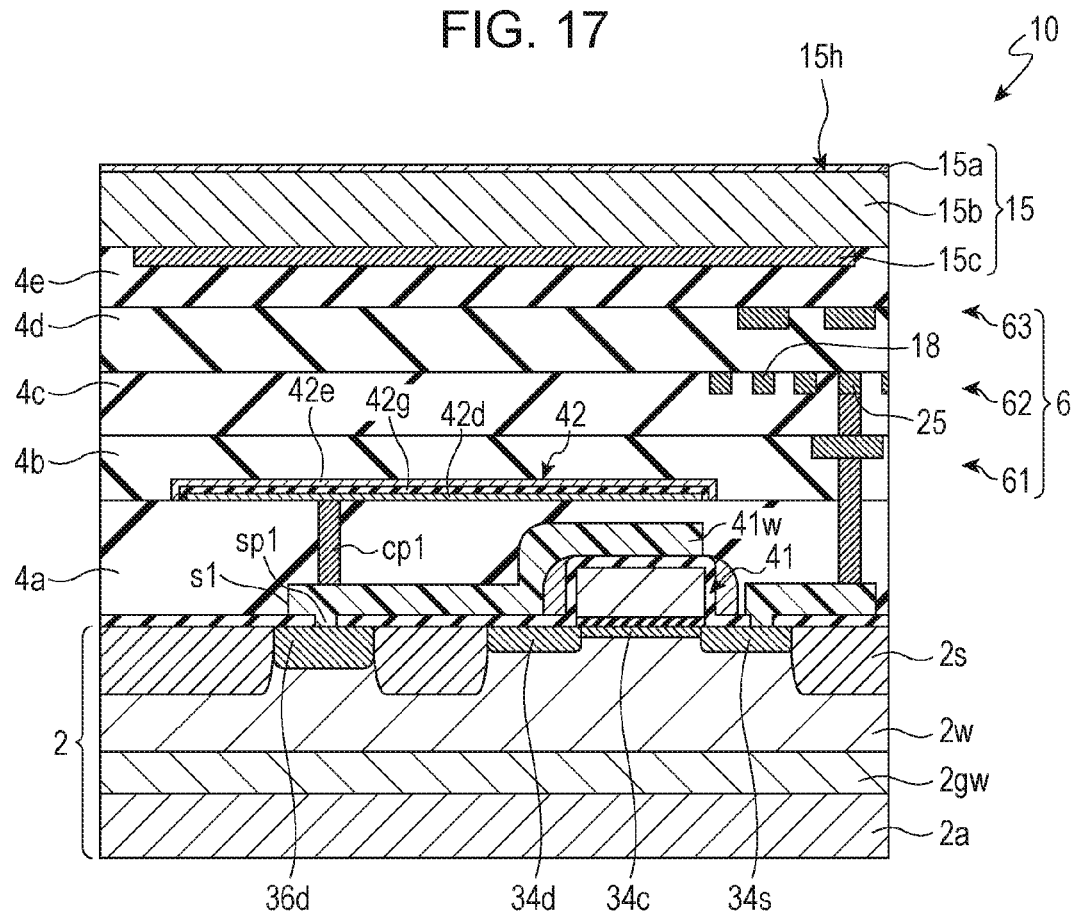
FIG. 17 is a schematic cross-sectional view taken along line XVII-XVII in FIG. 16.
Figure 18:
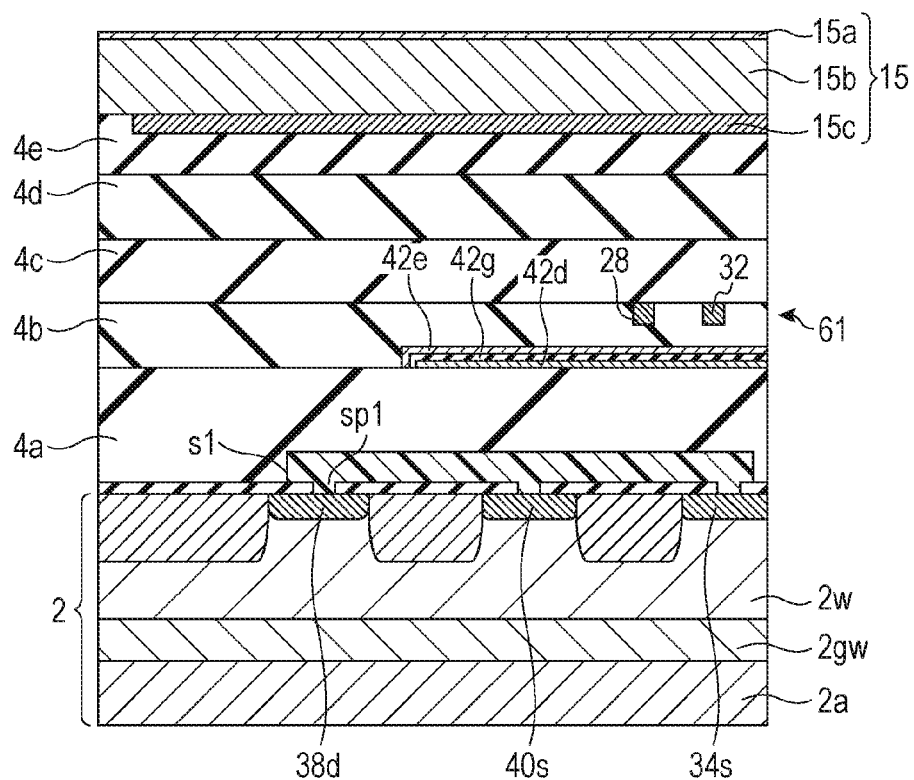
FIG. 18 is a schematic cross-sectional view taken along line XVIII-XVIII in FIG. 16.

FIG. 16 is a plan view schematically illustrating an example of the layout of some elements and some lines in the pixel 10 according to a fourth embodiment. FIG. 17 is a schematic cross-sectional view illustrating a cross section of a connection between the reset drain node 46 and the amplification transistor 34. FIG. 18 is a schematic cross-sectional view illustrating a cross section of connections among the feedback transistor 38, address transistor 40, and amplification transistor 34.

In the fourth embodiment, a method of connecting the diffusion layer 36d and first capacitor 41 together differs from the second embodiment. Specifically, as illustrated in FIG. 17, the diffusion layer 36d and first capacitor 41 are connected together by using the polysilicon layer s1. As illustrated in FIG. 18, the diffusion layer 38d of the feedback transistor 38, the diffusion layer 40s of the address transistor 40, and the diffusion layer 34s of the amplification transistor 34 are connected together through the polysilicon layer s1. The form of this connection is the same as in the second embodiment.

In the fourth embodiment as well, effects similar to those in the second and third embodiments are obtained. In this embodiment, the diffusion layer 36d and first capacitor 41 are connected together without the contact plug cp1 intervening therebetween. Therefore, connections can be reduced between the contact plug cp1 and the polysilicon layer s1 in the feedback path fb1. Connections can also be reduced between the contact plug cp1 and the lower electrode 42d of the second capacitor 42. Thus, the contact resistance component in the feedback path fb1 can be reduced. This can prevent current in the feedback path fb1 from being reduced and thereby can suppress a drop in feedback speed.

Fifth Embodiment

Next, another embodiment of the imaging device 100 will be described. Portions having an effect, function, shape, mechanism, or structure similar to that in the first to fourth embodiments described above are assigned the same reference characters, and these portions may not be described. The description below will focus on different points from the first to fourth embodiments, and repeated descriptions may be omitted.

Figure 19:
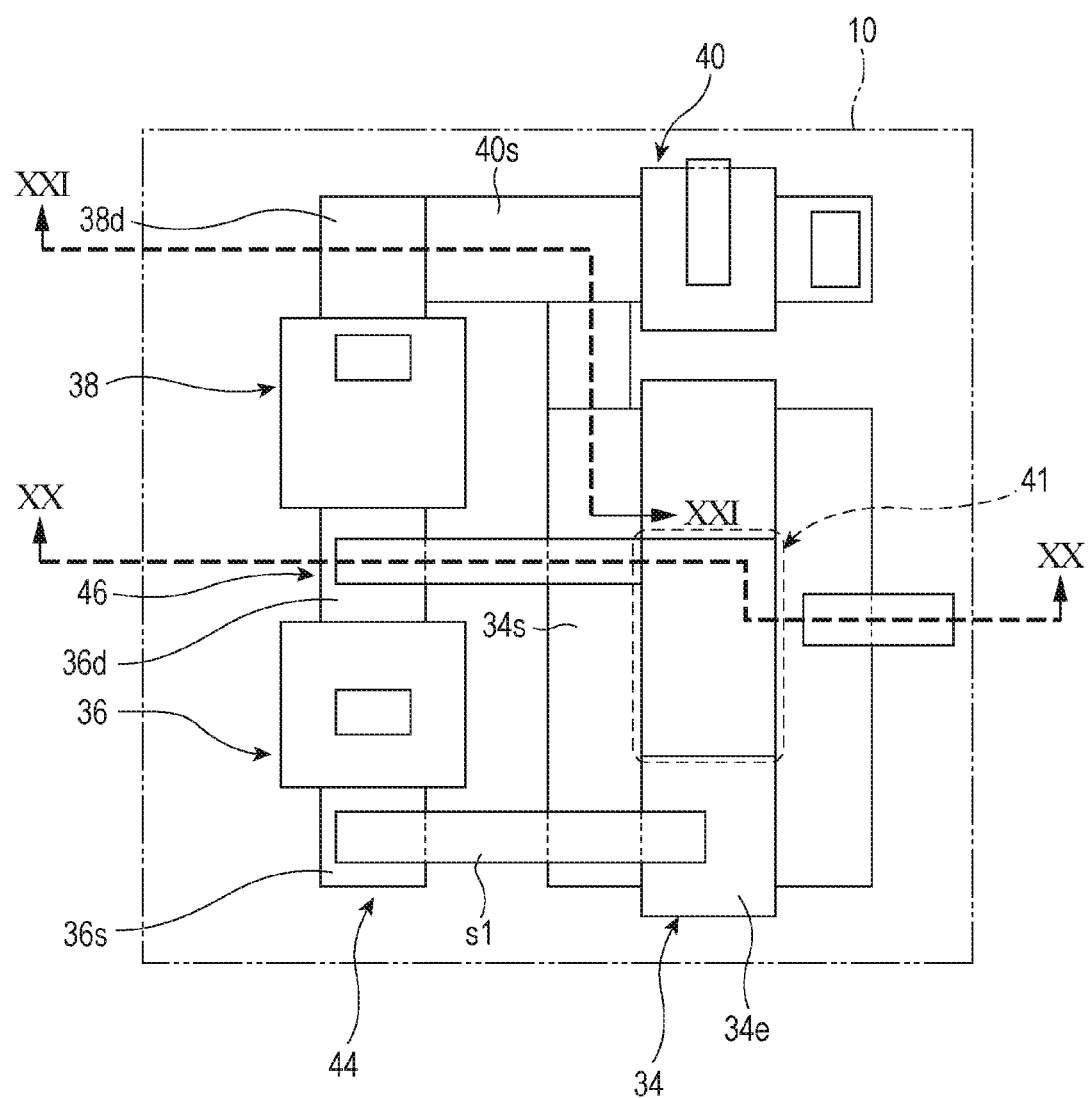
FIG. 19 is a plan view schematically illustrating an example of the layout of some elements and some lines in a pixel according to a fifth embodiment.
Figure 20:
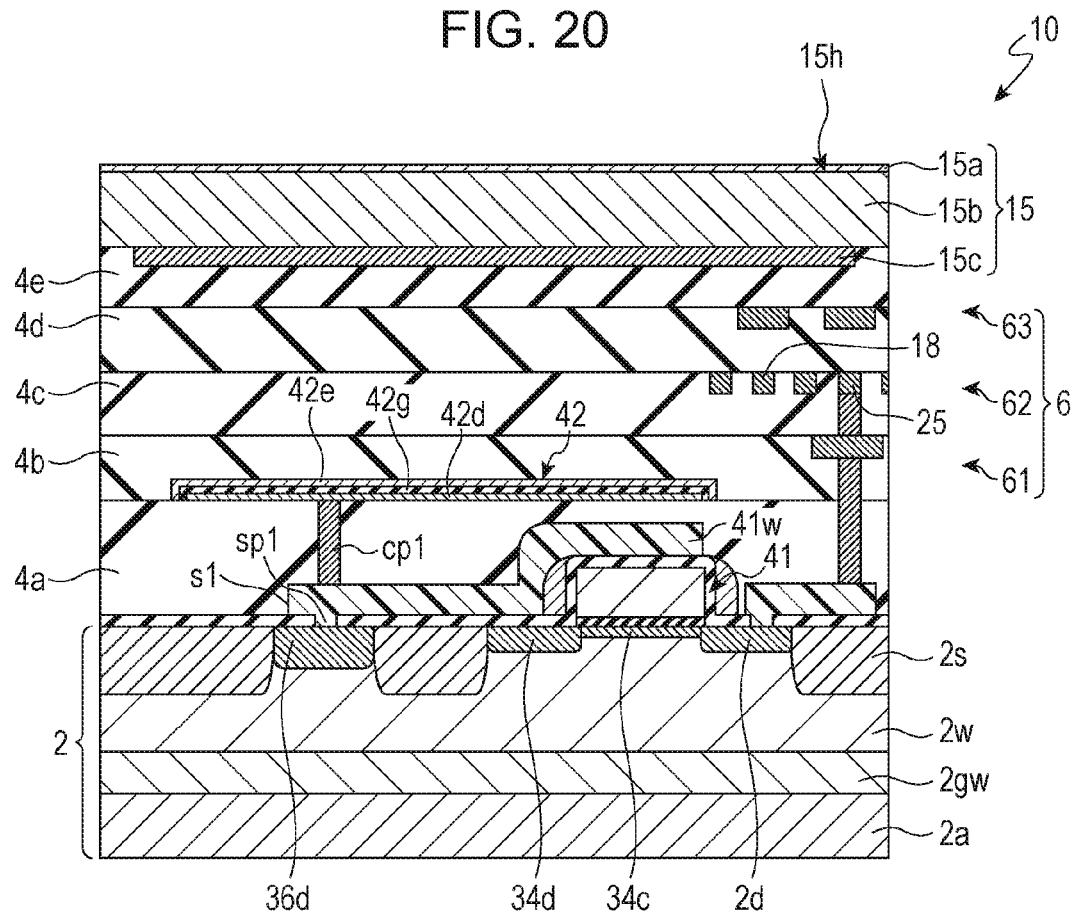
FIG. 20 is a schematic cross-sectional view taken along line XX-XX in FIG. 19.
Figure 21:
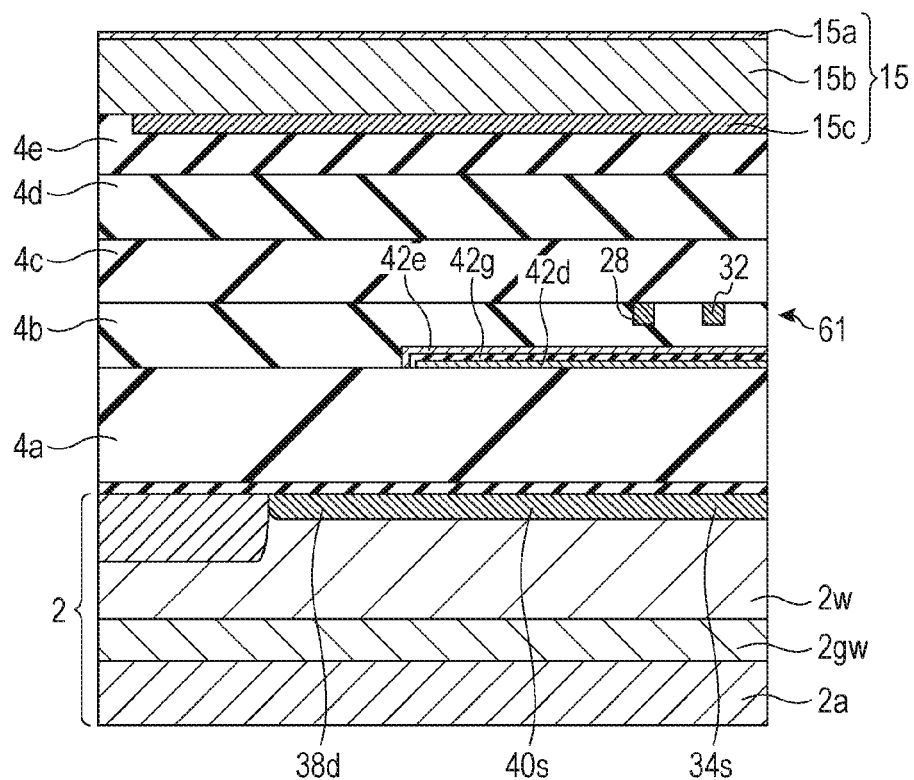
FIG. 21 is a schematic cross-sectional view taken along line XXI-XXI in FIG. 19.

FIG. 19 is a plan view schematically illustrating an example of the layout of some elements and some lines in the pixel 10 according to a fifth embodiment. FIG. 20 is a schematic cross-sectional view illustrating a cross section of a connection between the reset drain node 46 and the amplification transistor 34. FIG. 21 is a schematic cross-sectional view illustrating a cross section of connections among the feedback transistor 38, address transistor 40, and amplification transistor 34.

The diffusion layer 36d and first capacitor 41 are connected together as in the fourth embodiment. Specifically, as illustrated in FIG. 20, the diffusion layer 36d and the first capacitor 41 are connected together by using the polysilicon layer s1. The polysilicon layer s1 is closer to the semiconductor substrate 2 than the lower electrode 42d of the second capacitor 42 is.

In the fifth embodiment, a method of connecting the diffusion layer 38d and the diffusion layer 40s together and a method of connecting the diffusion layer 40s and diffusion layer 34s together differ from the fourth embodiment. Specifically, as illustrated in FIG. 21, a single diffusion layer fulfills the role of the diffusion layer 38d, diffusion layer 40s, and diffusion layer 34s. That is, the feedback transistor 38, address transistor 40, and amplification transistor 34 share a single diffusion layer.

In the fifth embodiment as well, effects similar to those in the fourth are obtained. In the fourth embodiment, the diffusion layer 38d, diffusion layer 40s, and diffusion layer 34s have been separated in the element separating area 2s before they are connected with the polysilicon plug sp1 and polysilicon layer s1. By contrast, in this embodiment, diffusion layers are not originally separated. Therefore, the internal resistance in the feedback path fb1 can be reduced by an amount equivalent to the resistances of contacts that are eliminated.

Sixth Embodiment

Next, another embodiment of the imaging device 100 will be described. Portions having an effect, function, shape, mechanism, or structure similar to that in the first to fifth embodiments described above are assigned the same reference characters, and these portions may not be described. The description below will focus on different points from the first to fifth embodiments, and repeated descriptions may be omitted.

Figure 22:
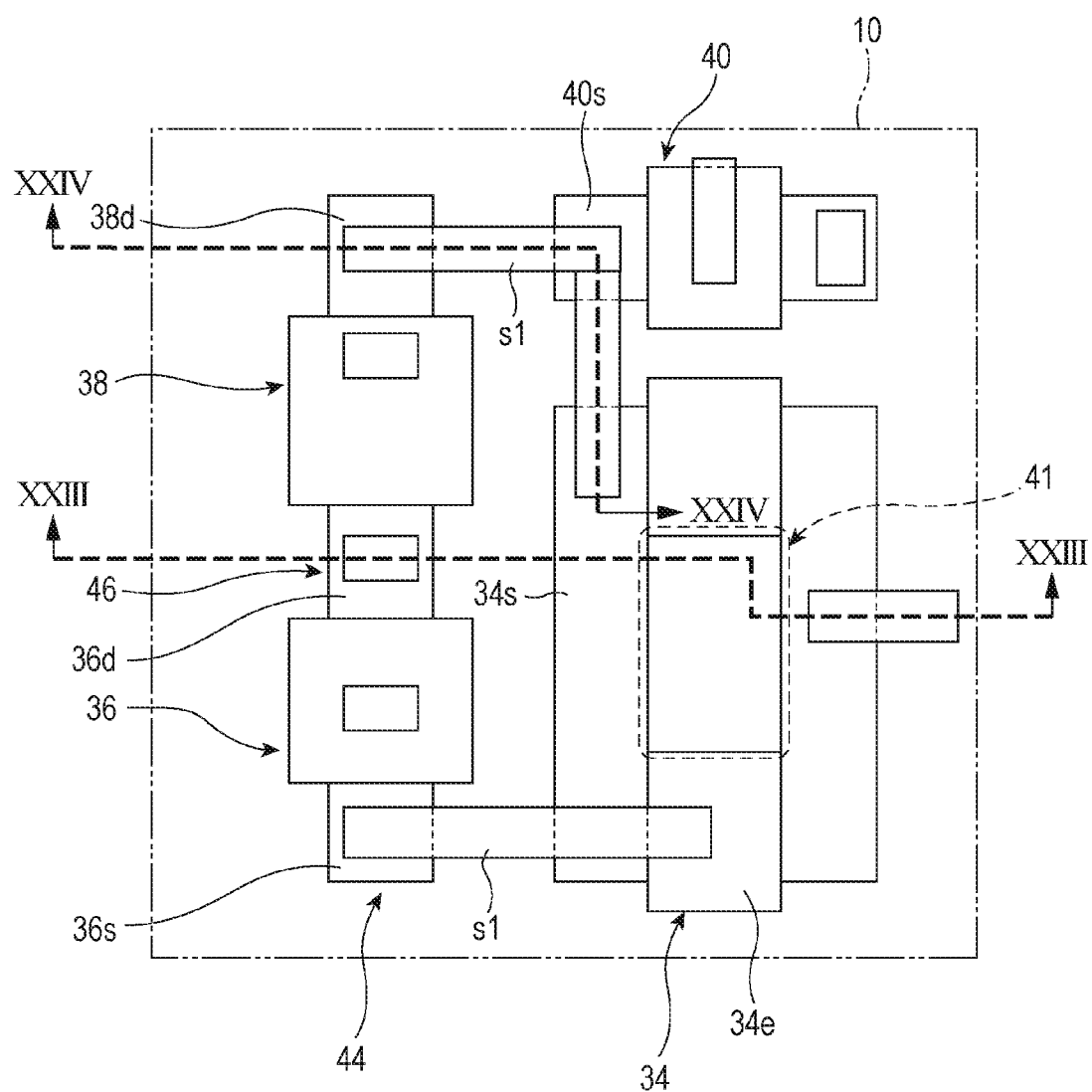
FIG. 22 is a plan view schematically illustrating an example of the layout of some elements and some lines in a pixel according to a sixth embodiment.
Figure 23:
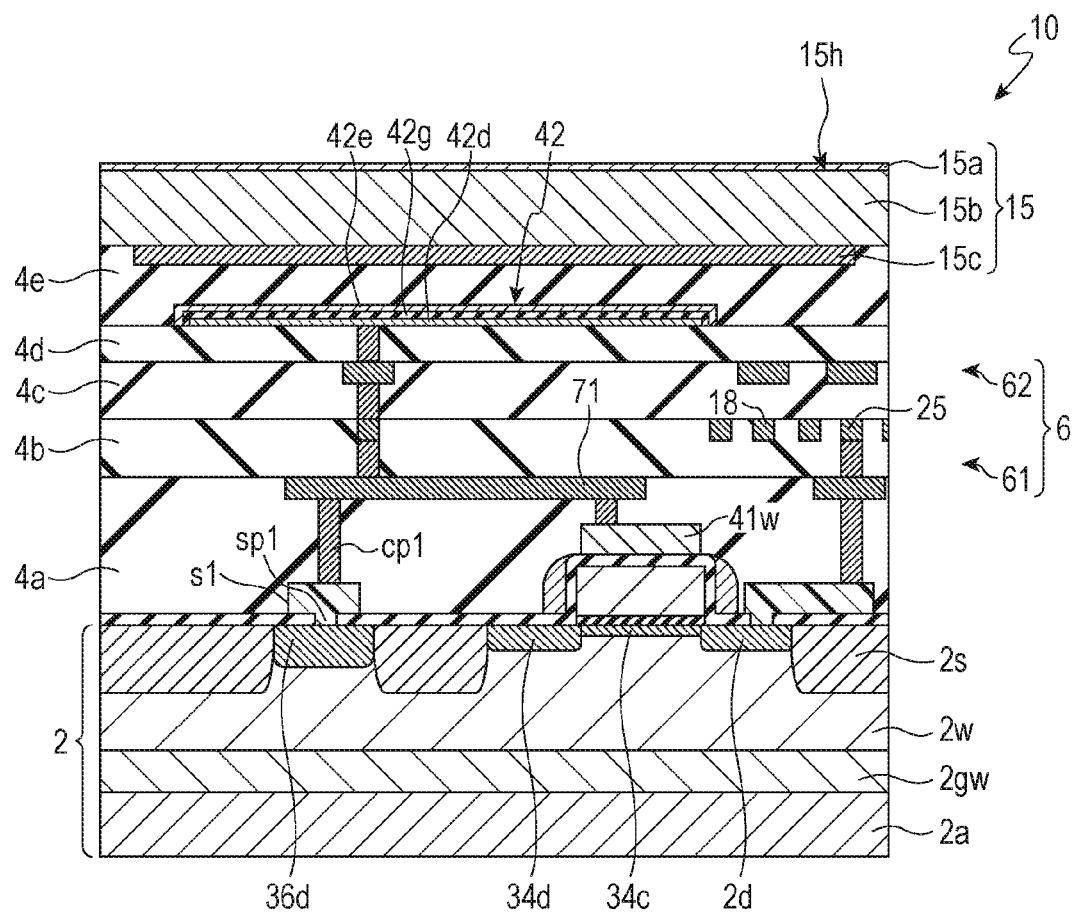
FIG. 23 is a schematic cross-sectional view taken along line XXIII-XXIII in FIG. 22.
Figure 24:
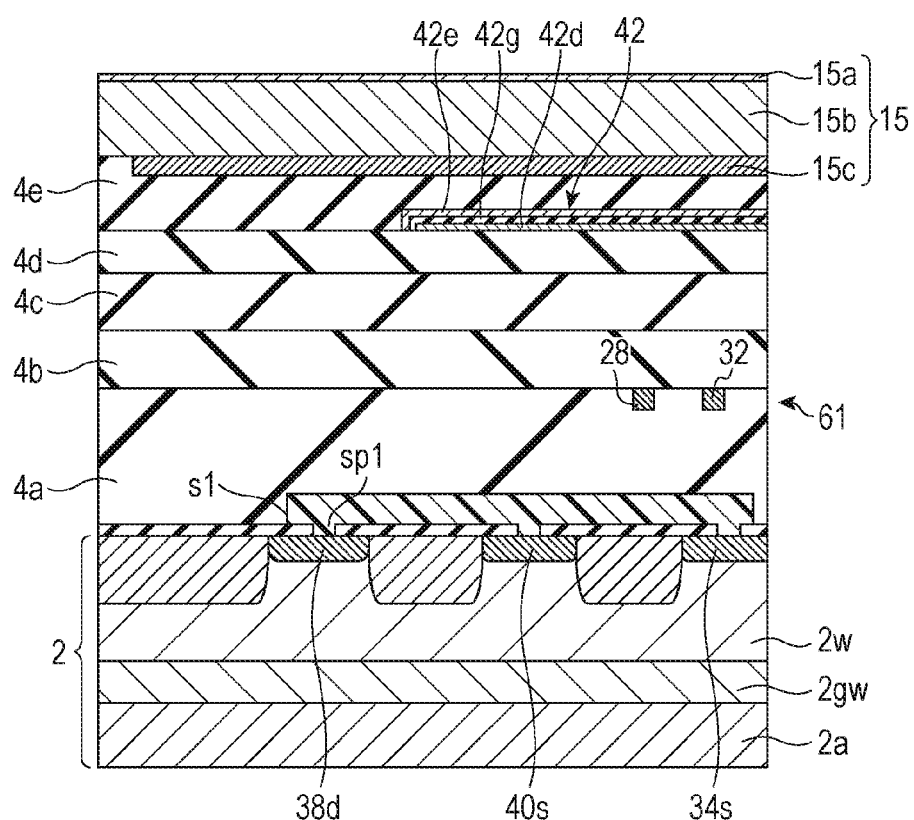
FIG. 24 is a schematic cross-sectional view taken along line XXIV-XXIV in FIG. 22.

FIG. 22 is a plan view schematically illustrating an example of the layout of some elements and some lines in the pixel 10 according to a sixth embodiment. FIG. 23 is a schematic cross-sectional view illustrating a cross section of a connection between the reset drain node 46 and the amplification transistor 34. FIG. 24 is a schematic cross-sectional view illustrating a cross section of connections among the feedback transistor 38, address transistor 40, and amplification transistor 34.

In the sixth embodiment, the placement of the second capacitor 42 differs from the second embodiment. Specifically, as illustrated in FIG. 23, the second capacitor 42 is placed in a layer above the vertical signal line 18 with respect to the semiconductor substrate 2. The lower electrode 42d of the second capacitor 42 is connected to the diffusion layer 36d, and the upper electrode 42e of the second capacitor 42 is connected to the sensitivity adjustment line 32.

The diffusion layer 36d and first capacitor 41 are connected together as in the second embodiment.

As illustrated in FIG. 24, a connection between the diffusion layer 38d and the diffusion layer 40s and a connection between the diffusion layer 40s and the diffusion layer 34s are also the same as in the first to fourth embodiments.

In this embodiment as well, effects similar to those in the first to fifth embodiments are obtained.

In this embodiment, the second capacitor 42 is placed in a layer above the second wiring layer 62. Therefore, the feedback path fb1 can be easily formed in a layer below the second wiring layer 62. When the second capacitor 42 is formed below the second wiring layer 62, to avoid a contact with the polysilicon plug sp1 with which the diffusion layer 36d and first capacitor 41 are connected together, there has been a limitation on an area in which the second capacitor 42 can be placed and the size of the area. In this embodiment, however, the size of the area occupied by the second capacitor 42 can be enlarged. Therefore, the dynamic range can be more increased.

Seventh Embodiment

Next, another embodiment of the imaging device 100 will be described. Portions having an effect, function, shape, mechanism, or structure similar to that in the first to sixth embodiments described above are assigned the same reference characters, and these portions may not be described. The description below will focus on different points from the first to sixth embodiments, and repeated descriptions may be omitted.

Figure 25:
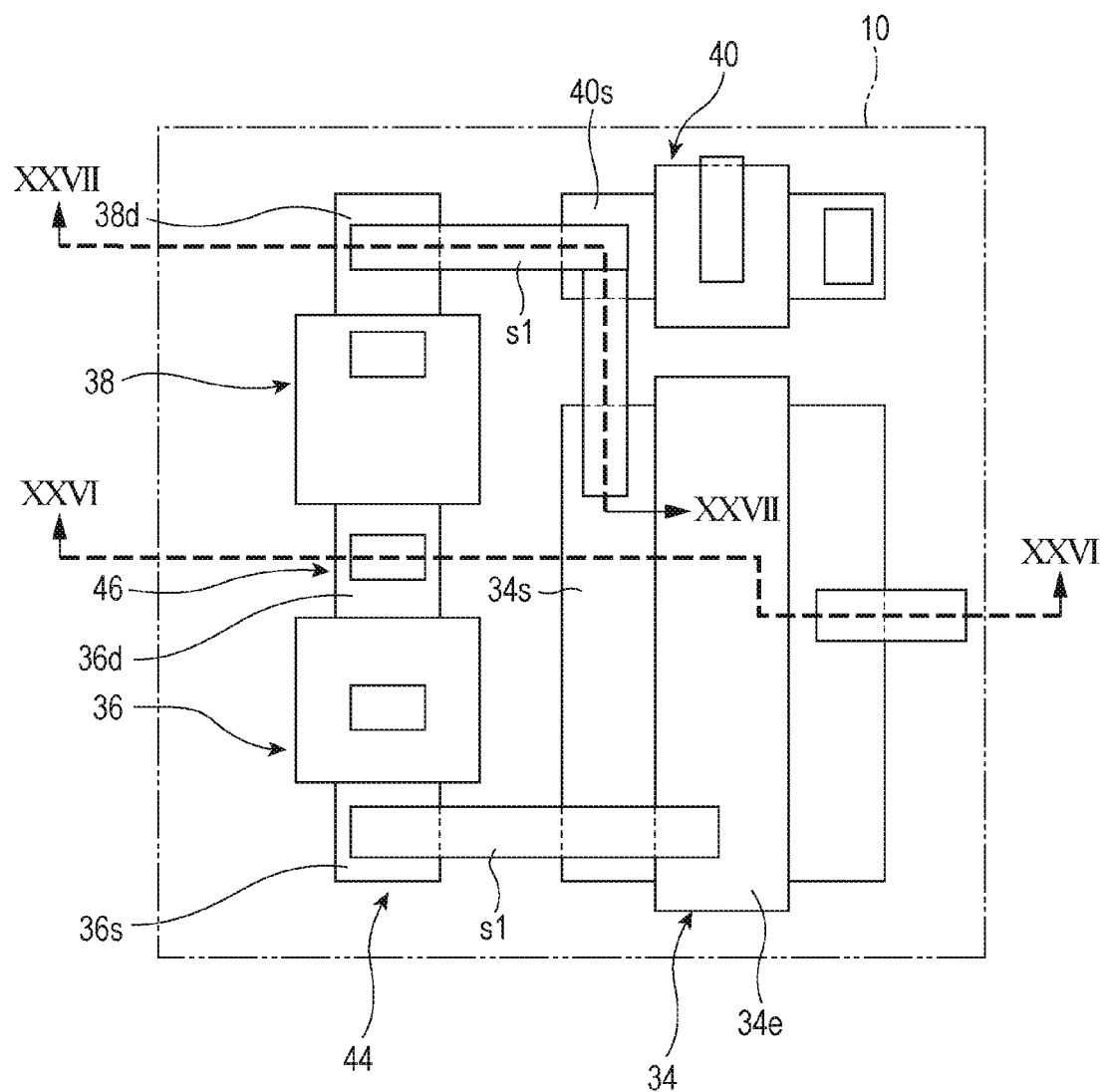
FIG. 25 is a plan view schematically illustrating an example of the layout of some elements and some lines in a pixel according to a seventh embodiment.
Figure 26:
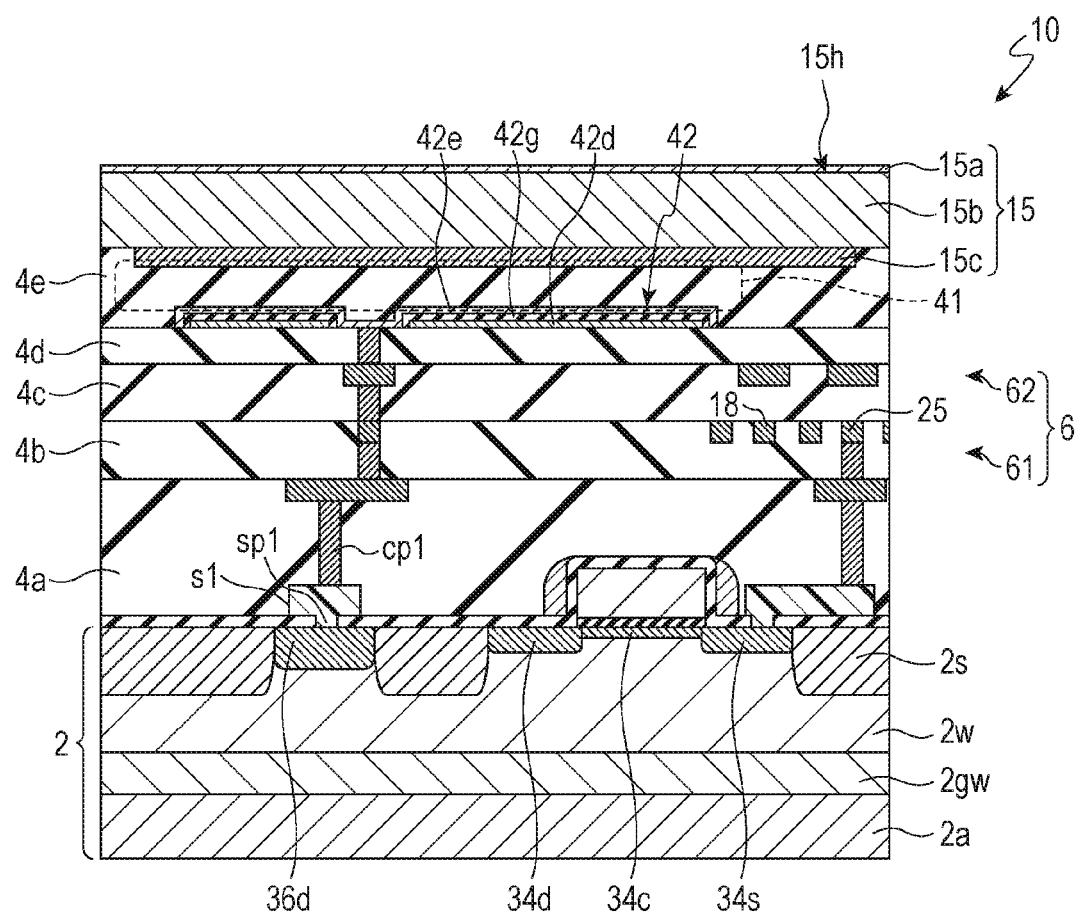
FIG. 26 is a schematic cross-sectional view taken along line XXVI-XXVI in FIG. 25.
Figure 27:
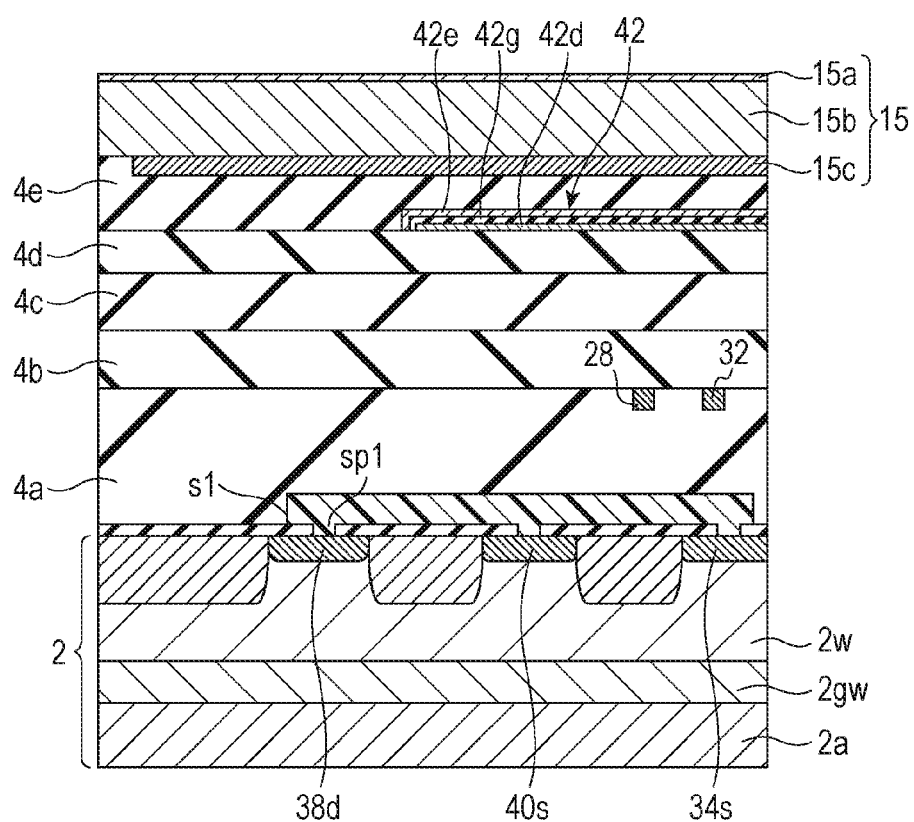
FIG. 27 is a schematic cross-sectional view taken along line XXVII-XXVII in FIG. 25.

FIG. 25 is a plan view schematically illustrating an example of the layout of some elements and some lines in the pixel 10 according to a seventh embodiment. FIG. 26 is a schematic cross-sectional view illustrating a cross section of a connection between the reset drain node 46 and the amplification transistor 34. FIG. 27 is a schematic cross-sectional view illustrating a cross section of connections among the feedback transistor 38, address transistor 40, and amplification transistor 34.

In this embodiment, the structure of the first capacitor 41 differs from the sixth embodiment. Specifically, as illustrated in FIG. 26, the second electrode 15c, the upper electrode 42e of the second capacitor 42, and the fifth insulating layer 4e positioned between the second electrode 15c and upper electrode 42e form the first capacitor 41. That is, the first capacitor 41 is placed in a layer above the vertical signal line 18 with respect to the semiconductor substrate 2. In this embodiment, the lower electrode 42d of the second capacitor 42 is connected to the sensitivity adjustment line 32, and the upper electrode 42e of the second capacitor 42 is connected to the diffusion layer 36d.

A connection between the diffusion layer 38d and the diffusion layer 40s and a connection between the diffusion layer 40s and the diffusion layer 34s are the same as in the fourth embodiment, as illustrated in FIG. 27.

In this embodiment as well, effects similar to those in the first to sixth embodiments are obtained. When the first capacitor 41 is placed closer to the photoelectric converter 15 than the second wiring layer 62 is, it also becomes possible to increase the capacity of the first capacitor 41.

Camera System

A camera system 105 having the imaging device 100 in this embodiment will be described with reference to FIG. 28.

Figure 28:
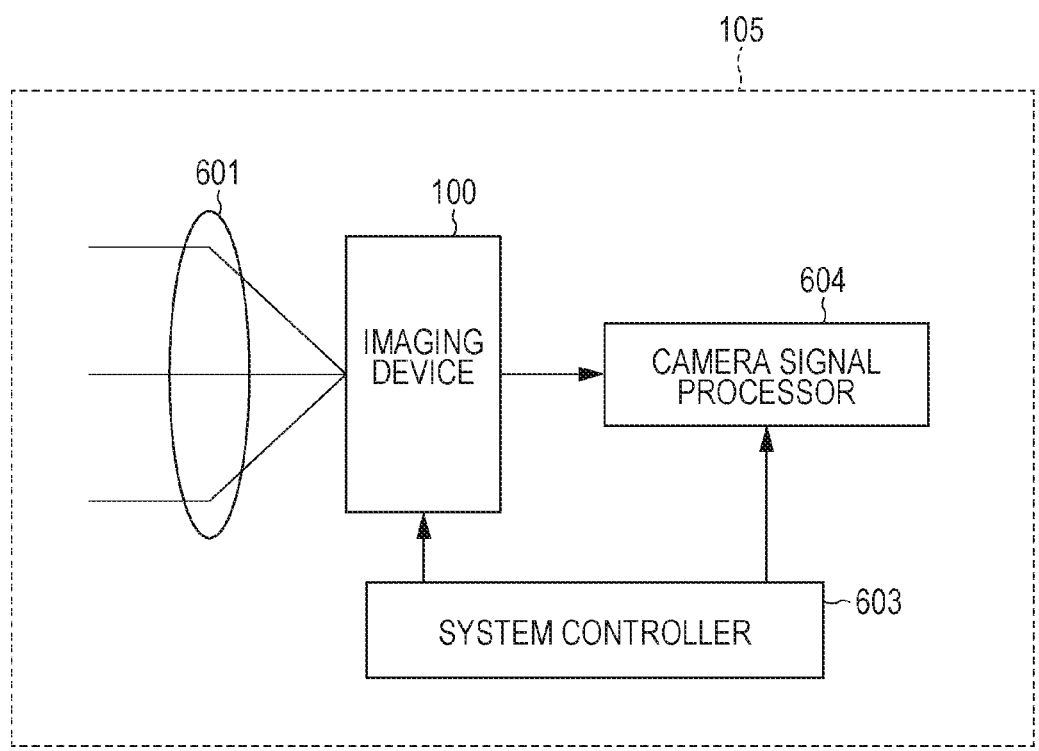
FIG. 28 is a block diagram schematically illustrating the structure of a camera system equipped with the imaging device.

FIG. 28 schematically illustrates an example of the structure of the camera system 105 according to this embodiment.

The camera system 105 has a lens optical system 601, the imaging device 100, a system controller 603, and a camera signal processor 604.

The lens optical system 601 includes, for example, an autofocus lens, a zooming lens, and a diaphragm. The lens optical system 601 focuses light onto the imaging surface of the imaging device 100.

As the imaging device 100, the imaging device 100 in the embodiments described above is used. The system controller 603 controls the whole of the camera system 105. The system controller 603 is implemented by, for example, a microcomputer.

The camera signal processor 604 functions as a signal processing circuit that processes an output signal from the imaging device 100. The camera signal processor 604 performs gamma correction, color interpolation processing, color interpolation processing, space interpolation processing, white balancing, and other processing, for example. The camera signal processor 604 is implemented by, for example, a digital signal processor (DSP).

The camera system 105 in this embodiment can appropriately suppress reset noise (kTC noise) at the time of read-out by using the imaging device 100 in the above embodiments and can accurately read out charges, enabling a superior image to be captured.

In addition, it is possible to implement a camera system that can make a switchover between a first mode, in which imaging is possible with relatively high sensitivity, and a second mode, in which imaging is possible with relatively low sensitivity, before taking a picture. In addition, it is possible to implement a wide dynamic range and to reduce noise.

According to this embodiment, kTC noise can be reduced. Furthermore, the dynamic range can be expanded with a simple structure. Therefore, this embodiment is useful for a digital camera and the like.

The present disclosure is not limited to the embodiments described above. For example, another embodiment implemented by combining arbitrary constituent elements described in this specification or excluding some constituent elements may be included in the present disclosure. In addition, variations obtained by applying various modifications that a person having ordinary skill in the art thinks of to the embodiments described above are also included in the present disclosure, without departing from the intended scope of the present disclosure, that is, the meanings indicated by the text in the claims of the present disclosure.

According to this embodiment, the influence of kTC noise can be reduced. This embodiment is useful for a digital camera and the like.

What is claimed is:

1. An imaging device comprising:
  a semiconductor substrate;
  pixels arranged in a first direction; and
  a signal line that extends in the first direction, wherein each of the pixels includes
    a photoelectric converter that generates signal charge by photoelectric conversion,
    a region into which the signal charge is input,
    a first transistor that outputs a signal to the signal line according to an amount of the signal charge input into the region,
    a capacity circuit that is coupled to a gate of the first transistor and that includes a first capacitive element, the first capacitive element including a first electrode, a second electrode and a first insulating layer between the first electrode and the second electrode, at least one of the first electrode and the second electrode containing a metal, the gate of the first transistor overlapping with both of the first electrode and the second electrode in a plan view, and the first capacitive element is located closer to the semiconductor substrate than the signal line is.

2. The imaging device according to claim 1, wherein the first electrode of the first capacitive element is coupled to either a voltage source or a ground.

3. The imaging device according to claim 1, wherein the capacity circuit includes a second capacitive element coupled to the first capacitive element in series.

4. The imaging device according to claim 3, wherein the second capacitive element is located closer to the semiconductor substrate than the signal line is.

5. The imaging device according to claim 1, wherein
the region includes a diffusion region in the semiconductor substrate, at least a part of the signal charge being input into the diffusion region, and
the first capacitive element is overlapped with the diffusion region in a plan view.

6. The imaging device according to claim 1, wherein each of the pixels includes a second transistor having a source and a drain, one of the source and the drain being coupled to a node between the first capacitive element and the second capacitive element, the other of the source and the drain being coupled to the gate of the first transistor.

7. The imaging device according to claim 1, wherein the photoelectric converter is in the semiconductor substrate.

8. The imaging device according to claim 1, wherein the first capacitive element is a MIM capacitor.

9. The imaging device according to claim 1, wherein the first capacitive element is located above the semiconductor substrate.

10. The imaging device according to claim 3, wherein the second capacitive element includes a third electrode, the gate of the first transistor, and an second insulating layer between the third electrode and the gate of the first transistor.

11. An imaging device comprising:
a semiconductor substrate;
pixels arranged in a first direction; and
a signal line that extends in the first direction, wherein each of the pixels includes
photoelectric converter that generates signal charge by photoelectric conversion,
a region into which the signal charge is input,
a first transistor that outputs a signal to the signal line according to an amount of the signal charge input into the region,
a capacity circuit that is coupled to a gate of the first transistor and that includes a first capacitive element, the first capacitive element including a first electrode, a second electrode and a first insulating layer between the first electrode and the second electrode, at least one of the first electrode and the second electrode containing a metal, the gate of the first transistor overlapping with both of the first electrode and the second electrode in a plan view, and
the signal line is located on an incident light side with respect to the first capacitive element.

12. The imaging device according to claim 11, wherein the first electrode of the first capacitive element is coupled to either a voltage source or a ground.

13. The imaging device according to claim 11, wherein the capacity circuit includes a second capacitive element coupled to the first capacitive element in series.

14. The imaging device according to claim 13, wherein the second capacitive element is located closer to the semiconductor substrate than the signal line is.

15. The imaging device according to claim 11, wherein
the region includes a diffusion region in the semiconductor substrate, at least a part of the signal charge being input into the diffusion region, and
the first capacitive element is overlapped with the diffusion region in a plan view.

16. The imaging device according to claim 11, wherein each of the pixels includes a second transistor having a source and a drain, one of the source and the drain being coupled to a node between the first capacitive element and the second capacitive element, the other of the source and the drain being coupled to the gate of the first transistor.

17. The imaging device according to claim 11, wherein the photoelectric converter is in the semiconductor substrate.

18. The imaging device according to claim 11, wherein the first capacitive element is a MIM capacitor.

19. The imaging device according to claim 11, wherein the first capacitive element is located above the semiconductor substrate.

20. The imaging device according to claim 13, wherein the second capacitive element includes a third electrode, the gate of the first transistor, and an second insulating layer between the third electrode and the gate of the first transistor.

* * * * *